US007745019B2

(12) United States Patent
Nomura et al.

(10) Patent No.: US 7,745,019 B2
(45) Date of Patent: Jun. 29, 2010

(54) LIGHT EMITTING ELEMENT AND LIGHT EMITTING DEVICE AND METHOD OF MANUFACTURING LIGHT EMITTING ELEMENT

(75) Inventors: Ryoji Nomura, Kanagawa (JP); Yasuyuki Arai, Kanagawa (JP); Kaoru Kato, Atsugi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1038 days.

(21) Appl. No.: 11/379,322

(22) Filed: Apr. 19, 2006

(65) Prior Publication Data

US 2006/0243967 A1 Nov. 2, 2006

(30) Foreign Application Priority Data

Apr. 28, 2005 (JP) ............................. 2005-130876

(51) Int. Cl.
*H01L 51/54* (2006.01)
(52) U.S. Cl. .................. 428/690; 428/917; 313/504; 313/506; 252/301.16; 257/40; 257/101; 257/102; 257/103
(58) Field of Classification Search ............. 428/690, 428/917; 313/504, 506; 257/40, 88–90, 257/94–97, 103, E51.01, E51.017, E51.024, 257/E51.041–E51.044; 252/301.16
See application file for complete search history.

(56) References Cited

U.S. PATENT DOCUMENTS

| 6,423,429 B2 | 7/2002 | Kido et al. |
| 6,580,213 B2 | 6/2003 | Yamazaki |
| 6,589,673 B1 | 7/2003 | Kido et al. |
| 7,041,390 B2 | 5/2006 | Seo et al. |
| 7,511,418 B2 | 3/2009 | Yamazaki et al. |
| 2002/0028329 A1* | 3/2002 | Ise et al. ................... 428/336 |
| 2002/0086180 A1* | 7/2002 | Seo et al. ................... 428/690 |
| 2002/0096995 A1* | 7/2002 | Mishima et al. ............. 313/506 |
| 2003/0127967 A1 | 7/2003 | Tsutsui et al. |
| 2003/0197465 A1* | 10/2003 | Qiu et al. ................... 313/504 |
| 2003/0209974 A1 | 11/2003 | Yamazaki |
| 2003/0218418 A9* | 11/2003 | Sato et al. ................... 313/504 |
| 2004/0012331 A1 | 1/2004 | Yamazaki et al. |
| 2005/0048311 A1* | 3/2005 | Hatwar et al. ............... 428/690 |
| 2005/0084712 A1* | 4/2005 | Kido et al. .................. 428/690 |
| 2005/0088083 A1 | 4/2005 | Seo et al. |
| 2005/0162074 A1 | 7/2005 | Madathil et al. |
| 2005/0260442 A1 | 11/2005 | Yu et al. |
| 2006/0119262 A1 | 6/2006 | Ikeda et al. |
| 2006/0244373 A1 | 11/2006 | Nomura et al. |
| 2006/0257684 A1* | 11/2006 | Arakane et al. ............. 428/690 |
| 2007/0200125 A1 | 8/2007 | Ikeda et al. |
| 2009/0026917 A1 | 1/2009 | Ikeda et al. |

FOREIGN PATENT DOCUMENTS

| JP | 11-251067 | 9/1999 |
| JP | 2001-244079 | 9/2001 |

OTHER PUBLICATIONS

Ren et al. "Ultrahigh energy gap hosts in deep blue organic electrophosphorescent devices." Chem. Mater. 2004, vol. 16, pp. 4743-4747.*

Jingsong Huang et al.; "High-brightness organic double-quantum-well electroluminescent devices"; *Applied Physics Letters*, vol. 77, No. 12; pp. 1750-1752; Sep. 18, 2000.

* cited by examiner

*Primary Examiner*—D. Lawrence Tarazano
*Assistant Examiner*—Michael Wilson
(74) *Attorney, Agent, or Firm*—Fish & Richardson P.C.

(57) ABSTRACT

A light emitting element of the present invention includes a pair of electrodes, a layer containing a composite material, and a light emitting region; wherein the layer containing a composite material contains an organic compound and an inorganic compound; the light emitting region contains a material having a high light emitting property and a material having a high carrier transporting property, and a region containing high concentration of the material having a high light emitting property and a region containing high concentration of the material having a high carrier transporting property are alternately stacked in the light emitting region.

36 Claims, 16 Drawing Sheets

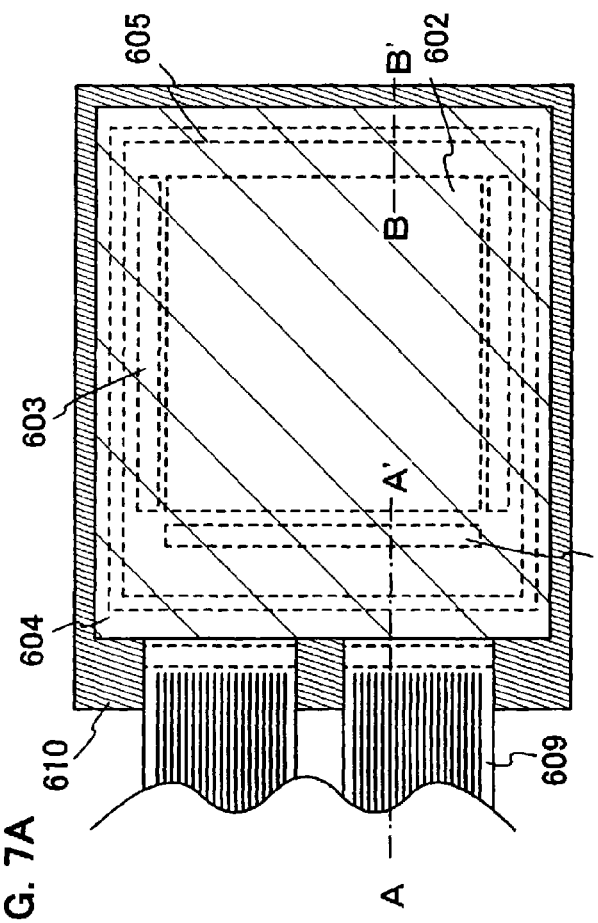
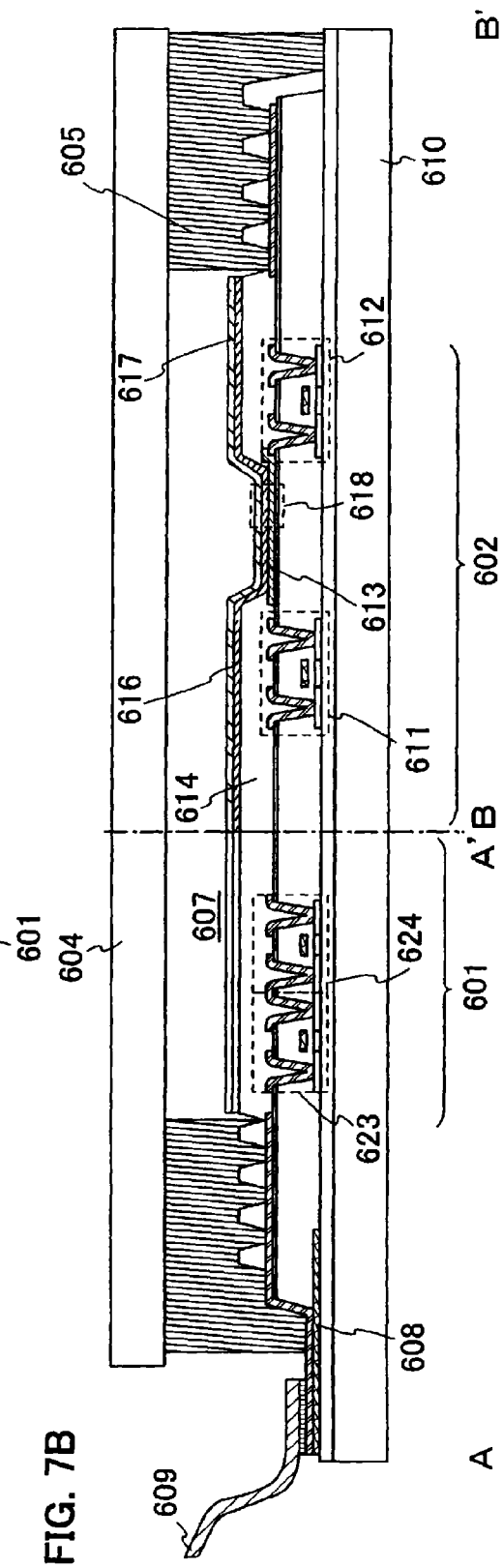
FIG. 7A
FIG. 7B

LIGHT EMITTING ELEMENT AND LIGHT EMITTING DEVICE AND METHOD OF MANUFACTURING LIGHT EMITTING ELEMENT

BACKGROUND OF THE INVENTION

1. Field of the Invention

The present invention relates to a light emitting element using electroluminescence and a light emitting device provided with the light emitting element. The invention further relates to a method of manufacturing a light emitting element.

2. Description of the Related Art

In recent years, a light emitting element using a light emitting organic compound has been actively researched and developed. In a basic structure of this light emitting element, a layer containing a light emitting organic compound is sandwiched between a pair of electrodes. By applying voltage to this element, electrons and holes are separately injected from the pair of electrodes into the layer containing a light emitting organic compound, and current flows. Then, recombination of these carriers (the electrons and holes) causes the light emitting organic compound to form an excited state and to emit light when the excited state returns to a ground state. With such a mechanism, such a light emitting element is referred to as a current-excitation light emitting element.

Note that an excited state of an organic compound can be a singlet excited state or a triplet excited state. Light emission from the singlet excited state is referred to as fluorescence, and light emission from the triplet excited state is referred to as phosphorescence.

Since the light emitting element is formed of an organic thin film, for example, with a thickness of approximately 0.1 μm, it is a great advantage of such a light emitting element that the light emitting element can be manufactured to be thin and lightweight. In addition, since time between carrier injection and light emission is approximately 1 μsec or less, the extremely high response speed is another advantage. These characteristics are considered suitable for a flat panel display element.

Such a light emitting element is formed in a film shape. Thus, surface emission can be easily achieved by forming a large-area element. This characteristic is hardly obtained in the case of a point light source typified by an incandescent lamp or an LED or a linear light source typified by a fluorescent lamp. Therefore, the above described light emitting element also has a high utility value as a surface light source which is applicable to lighting or the like.

As described above, a current-excitation light emitting element using the light emitting organic compound is expected to be applied to a light emitting device, lighting, and the like. However, there are still many issues. One of the issues is a reduction in power consumption. It is important to reduce drive voltage of the light emitting element in order to reduce power consumption. Since emission intensity of the current-excitation light emitting element depends on the amount of current flowing therethrough, it is necessary to make a large amount of current to flow at low voltage in order to reduce the drive voltage.

Meanwhile, as a structure of a light emitting element, a multiple quantum well structure is reported (Reference 1: Jingsong H, Kaixia Y, Shiyong L, and Hongjin J, Applied Physics Letters, Vol. 77, No. 12, 1750-1752, 2000). According to the Reference 1, it is considered that when a light emitting layer has a multiple quantum well structure, carriers are efficiently recombined and the luminous efficiency is increased.

Normally, a light emitting element is formed over a substrate provided with a thin film transistor (hereinafter referred to as a TFT) or the like. However, the process flow for forming a TFT is very complicated, and minute foreign bodies are easily generated; thus, it is difficult to remove the generated foreign bodies. In the case where the minute foreign bodies remain on the electrode, the film thickness of the element becomes nonuniform and a good light-emission cannot be obtained.

Further, as described in the Reference 1, the thickness of a layer of the multiple quantum well structure is as thin as approximately 3 nm. Accordingly, in the case where a layer of a multiple quantum well structure has minute foreign bodies, there may be a defect in the multiple quantum well structure. In other words, the multiple quantum well structure itself becomes difficult to be formed, and the effect of the multiple quantum well structure may not be obtained.

Further, in the case of forming the multiple quantum well structure, mainly vapor deposition is used. By controlling open/close of a shutter provided between an evaporation source and the substrate, the multiple quantum well structure may be formed. However, when the multiple quantum well structure is formed by controlling open/close of the shutter, the film formation takes more time and the throughput may be decreased.

SUMMARY OF THE INVENTION

In view of the above problems, it is an object of the present invention to provide a light emitting element with high luminous efficiency, less defects, and low drive voltage, and a light emitting device having such a light emitting element. It is another object of the invention to provide a method of manufacturing such a light emitting element in simpler manner compared with a conventional manner.

The present inventors made every effort to study this and consequently found that the problems can be solved by manufacturing a light emitting element having a layer containing a composite material and a light emitting region having a multiple quantum well structure.

A light emitting element of an aspect of the present invention includes a layer containing a composite material, and a light emitting region which are provided between a pair of electrodes; wherein the layer containing a composite material contains an organic compound and an inorganic compound; the light emitting region contains a material having a high light emitting property and a material having a high carrier transporting property, and the light emitting region in which a region containing higher concentration of the material having a high light emitting property than the concentration of the material having a high carrier transporting property and a region containing higher concentration of the material having a high carrier transporting property than concentration of the material having a high light emitting property are alternately stacked. Further, a light emitting element of another aspect of the present invention includes a first electrode, a first layer containing an organic compound and an inorganic compound over the first electrode, a second layer including a first, second and third regions over the first layer, wherein the second region is formed between the first region and the third region, wherein the second layer contains a material having a high light emitting property and a material having a high carrier transporting property, wherein a concentration of the material having a high carrier transporting property is higher than a concentration of the material having a high carrier transporting property in the first and third regions, and wherein a concentration of the material having a high light emitting property is higher than a concentration of the material having a high carrier transporting property in the second region. Here, "high light emitting property" means having a higher quantum yield than the material having a high carrier transporting property, and "high carrier transporting property" means having a higher mobility than the material having a high light emitting property. The material having a high light emitting property preferably has a quantum yield higher than 30%.

In the above structure, a highest occupied molecular orbital level of the material having a high light emitting property is higher than a highest occupied molecular orbital level of the material having a high carrier transporting property, and a lowest unoccupied molecular orbital of the material having a high light emitting property is lower than a lowest unoccupied molecular orbital level of the material having a high carrier transporting property.

In the above structure, the region having higher concentration of the material having a high light emitting property than the concentration of the material having a high carrier transporting property has a thickness of 20 nm or less, preferably, 5 nm or less.

Further, in the above structure, the region having high concentration of the material having a high carrier transporting property has a thickness of 20 nm or less, preferably, 5 nm or less.

A light emitting element includes a layer containing a composite material and a light emitting region which are provided between a pair of electrodes; wherein the layer containing a composite material contains an organic compound and an inorganic compound; the light emitting region contains a material having a high light emitting property and a material having a high carrier transporting property, and the light emitting region where a region in which the material having a high light emitting property is dispersed in the material having a high carrier transporting property and a region containing higher concentration of the material having a high carrier transporting property than the concentration of the material having a high light emitting property are alternately stacked.

In the above structure, a highest occupied molecular orbital level of the material having a high light emitting property is higher than a highest occupied molecular orbital level of the material having a high carrier transporting property, and a lowest unoccupied molecular orbital of the material having a high light emitting property is lower than a lowest unoccupied molecular orbital level of the material having a high carrier transporting property.

In the above structure, a region in which the material having a high light emitting property is dispersed in the material having a high carrier transporting property has a thickness of 20 nm or less, preferably, 5 nm or less.

Further, in the above structure, the region having higher concentration of the material having a high carrier transporting property than the concentration of the material having a high light emitting property has a thickness of 20 nm or less, preferably, 5 nm or less.

In the above structure, the region in which the material having a high light emitting property is dispersed in the material having a high carrier transporting property contains 0.001 wt % to 50 wt %, preferably, 0.03 wt % to 30 wt % of the material having a high light emitting property.

In the above structure, the material having a high light emitting property may be whichever of a material which fluoresces or a material which phosphoresces. Note that, in the case of the material which fluoresces, the triplet level of the material having a high light emitting property is preferably lower than the triplet level of the material having a high carrier transporting property.

In the above structure, the material having a high carrier transporting property may have an electron transporting property higher than a hole transporting property; alternatively, the material having a high carrier transporting property may have a hole transporting property higher than an electron transporting property.

In the above structure, the layer containing a composite material is preferably provided in contact with one of the pair of electrodes. Alternatively, two layers containing a composite material may be provided so that the layer which are severally in contact with either of the pair of electrodes.

Further, in the above structure, the inorganic compound is a transition metal oxide. Specifically, one of titanium oxide, zirconium oxide, hafnium oxide, vanadium oxide, niobium oxide, tantalum oxide, chromium oxide, molybdenum oxide, tungsten oxide, manganese oxide, or rhenium oxide; or a mixture thereof can be used.

In the above structure, the organic compound has hole transporting property. Specifically, the organic compound contains an arylamine skeleton or a carbazole skeleton.

Further, the present invention includes a light emitting device having a light emitting element described above. A light emitting device in this specification has a light emitting element and a control device for controlling light emission of the light emitting element. Specifically, the light emitting device includes an image display device and a light source (including a lighting system). In addition, the light emitting device includes all of a module where a light emitting device is provided with a connector such as an FPC (Flexible Printed Circuit), a TAB (Tape Automated Bonding) tape, or a TCP (Tape Carrier Package); a module where an end of the TAB tape or TCP is provided with a printed wiring board; and a module where an IC (Integrated Circuit) is directly mounted on a light emitting element by COG (Chip On Glass) method.

Further, the present invention will provide a method of manufacturing a light emitting element described above. Accordingly, in a method of manufacturing a light emitting element according to the invention, a vapor deposition apparatus having a rotating plate for holding a substrate and a holder for holding a plurality of evaporation sources which are opposite to the substrate is used; a material having a high light emitting property is held by a first evaporation source; a material having a high carrier transporting property is held by a second evaporation source; distance between the substrate and the first evaporation source and distance between the substrate and the second evaporation source are changed by rotating the rotating plate; and materials are sublimated from the first evaporation source and the second evaporation source while rotating the rotating plate, so that a layer containing the material having a high light emitting property and the material having a high carrier transporting property are formed on the substrate.

Further, in a method of manufacturing a light emitting element, a vapor deposition apparatus having a holder for holding a substrate and a rotating plate for holding a plurality of evaporation sources which are opposite to the substrate is used; a material having a high light emitting property is held by a first evaporation source; a material having a high carrier transporting property is held by a second evaporation source, distance between the substrate and the first evaporation source and distance between the substrate and the second evaporation source are changed by rotating the rotating plate; and materials are sublimated from the first evaporation source and the second evaporation source while rotating the rotating plate, so that a layer containing the material having a high light emitting property and the material having a high carrier transporting property are formed on the substrate.

In a method of manufacturing a light emitting element according to the present invention, a vapor deposition apparatus having a holder for holding a substrate, another holder for holding a plurality of evaporation sources, and a rotating plate having an opening is used; a first material is held by a first evaporation source; a material having a high carrier transporting property is held by a second evaporation source, an amount of a material which reaches the substrate from the first evaporation source and an amount of a material which reaches the substrate from the second evaporation source are changed by rotating the rotating plate having an opening; and materials are sublimated from the first evaporation source and the second evaporation source while rotating the rotating plate having an opening, so that a layer containing the first material and the material having a high carrier transporting property are formed on the substrate.

In a method of manufacturing a light emitting element according to the present invention, a vapor deposition apparatus having a rotating plate for holding a substrate and a holder for holding a plurality of evaporation sources is used; a first material is held by a first evaporation source; a second material is held by a second evaporation source; and the rotating plate is rotated thereby a region containing higher concentration of a first material having a high light emitting property than a second material having a high carrier transporting property is formed on a substrate when distance between the first evaporation source and the substrate is shorter than distance between the second evaporation source and the substrate, and thereby a region containing higher concentration of a second material than a concentration of a first material is formed on the substrate when distance between the second evaporation source and the substrate is shorter than distance between the first evaporation source and the substrate; and the region containing higher concentration of the first material than the concentration of the second material and the region containing higher concentration of the second material than the concentration of the first material are formed alternately.

In a method of manufacturing a light emitting element according to the present invention, a vapor deposition apparatus having a holder for holding a substrate and a rotating plate for holding a plurality of evaporation sources which are opposite to the substrate is used; a first material is held by a first evaporation source; a second material is held by a second evaporation source; and the rotating plate is rotated thereby a region containing higher concentration of a first material having a high light emitting property is formed on a substrate when distance between the first evaporation source and the substrate is shorter than distance between the second evaporation source and the substrate, and thereby a region containing higher concentration of a second material than a concentration of a first material is formed on the substrate when distance between the second evaporation source and the substrate is shorter than distance between the first evaporation source and the substrate; and the region containing higher concentration of the first material than the concentration of the second material and the region containing higher concentration of the second material than the concentration of the first material are formed alternately.

In a method of manufacturing a light emitting element according to the present invention, a vapor deposition apparatus having a holder for holding a substrate, another holder for holding a plurality of evaporation sources, and a rotating plate having an opening is used; a first material is held by a first evaporation source; a second material is held by a second evaporation source; and the rotating plate having an opening is rotated thereby a region containing higher concentration of a first material having a high light emitting property than a concentration of a second material having a high carrier transporting property is formed on a substrate when the opening is disposed closer to a first evaporation source than to a second evaporation source, and thereby a region containing higher concentration of a second material than a concentration of a first material is formed on the substrate when the opening is disposed closer to the second evaporation source than to the first evaporation source; and the region containing higher concentration of the first material than the concentration of the second material and the region containing higher concentration of the second material than the concentration of the first material are formed alternately.

A light emitting element of the present invention includes a light emitting region having a multiple quantum well structure; thus, the luminous efficiency is high.

Further, the thickness of a layer other than a light emitting region is increased. In particular, the thickness of the layer on a substrate side where a TFT or the like is formed is increased; thus, a light emitting region having a multiple quantum well structure can be formed over a layer in which irregularities due to minute foreign bodies on the electrode surface are reduced. Accordingly, the effects of a multiple quantum well structure can be acquired more efficiently; thus, a light emitting element with high luminous efficiency can be obtained.

Further, the thickness of a layer other than a light emitting region is increased, so that a light emitting element in which defects such as short circuit between electrodes or the like are reduced can be obtained.

Further, the thickness of a layer other than a light emitting region can be increased with suppressing increase in the drive voltage.

Since a light emitting device of the invention has a light emitting element with high luminous efficiency, fewer defects, and low drive voltage, a light emitting device of low power consumption and less defects can be obtained.

Further, since a multiple quantum well structure can be formed more easily by a method of manufacturing a light emitting element of the present invention as compared with the conventional methods; thus, the throughput can be improved by employing the method of manufacturing a light emitting element according to the invention.

BRIEF DESCRIPTION OF DRAWINGS

FIGS. 7A and 7B are diagrams for explaining a light emitting device of the present invention.

FIGS. 10A-1 to 10A-3 are diagrams for explaining a light emitting element of the present invention.

DETAILED DESCRIPTION OF THE INVENTION

Figure 1A:
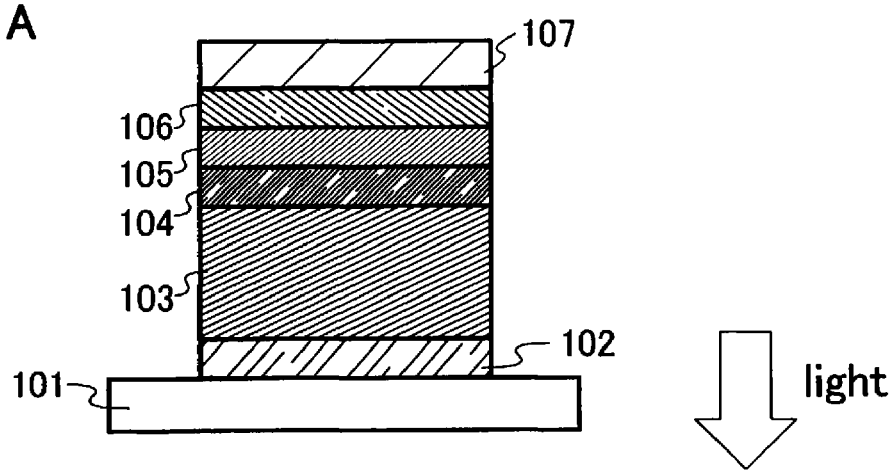
FIGS. 1A to 1C are diagrams for explaining a light emitting element of the present invention.

Embodiments according to the present invention will be hereinafter described with reference to the accompanying drawings. The present invention is not limited to the following description. The present invention can be carried out in many different modes, and it is easily understood by those skilled in the art that modes and details disclosed herein can be modified in various ways without departing from the spirit and the scope of the present invention. It should be noted that the present invention should not be interpreted as being limited to the description of the embodiments below.

Embodiment 1

In this embodiment, a layer containing a composite material used for a light emitting element of the present invention will be described. The layer containing a composite material used for a light emitting element of the invention contains an organic compound and an inorganic compound.

An organic compound contained in the layer containing a composite material is preferably a material superior in hole transporting property. In particular, an organic compound material having an arylamine skeleton, for example, a compound of aromatic amines (namely, having a benzene ring-nitrogen bond) such as 4,4'-bis (N-{4-[N,N'-bis(3-methylphenyl)amino]phenyl}-N-phenylamino)biphenyl (abbreviated as DNTPD), 4,4'-bis[N-(4-diphenylaminophenyl)-N-phenylamino]biphenyl (abbreviated as DPAB), N,N'-bis(3-methylphenyl)-N,N'-diphenyl-[1,1'-biphenyl]-4,4'-diamine (abbreviated as TPD), 4,4'-bis[N-(1-naphthyl)-N-phenylamino]biphenyl (abbreviated as a-NPD), 4,4'-bis[N-(9,9-dimethylfluorene-2-yl)-N-phenylamino]biphenyl (abbreviated as DFLDPBi), 4,4'-bis[N-(4-biphenylyl)-N-phenylamino]biphenyl (abbreviated as BBPB), 1,5-bis(diphenylamino)naphthalene (abbreviated as DPAN), 4,4',4''-tris (N,N-diphenylamino)triphenylamine (abbreviated as TDATA), and 4,4',4''-tris[N-(3-methylphenyl)-N-phenylamino]triphenylamine (abbreviated as MTDATA) can be used. Alternatively, an organic material having a carbazole skeleton is preferably used, for example, a compound of N-(2-naphthyl)carbazole (abbreviated as NCz), 4,4'-di(N-carbazolyl)biphenyl (abbreviated as CBP), 9,10-bis[4-(N-carbazolyl)phenyl]anthracene (abbreviated as BCPA), 3,5-bis[4-(N-carbazolyl)phenyl]biphenyl (abbreviated as BCPB), or 1,3,5-tris[4-(N-carbazolyl)phenyl]benzene (abbreviated as TCPB) can be used. Note that other materials may be used as long as they transport holes more easily than electrons.

Further, as an inorganic compound contained in the layer containing a composite material, a transition metal oxide is preferable, specifically, titanium oxide, zirconium oxide, hafnium oxide, vanadium oxide, niobium oxide, tantalum oxide, chromium oxide, molybdenum oxide, tungsten oxide, manganese oxide, rhenium oxide, or the like can be used. In particular, vanadium oxide, molybdenum oxide, tungsten oxide, and rhenium oxide are preferable because of high electron accepting ability. Above all, molybdenum oxide is preferable since stable even under an ambient atmosphere and it can be handled easily.

Note that a layer containing a composite material in a light emitting element of the invention can be manufactured by vapor deposition. Note that molybdenum oxide is easy to evaporate in vacuum so that it is preferable in terms of a manufacturing process.

A composite material used in the present invention is highly conductive because carriers have been generated therein; thus, a light emitting element can be driven by low voltage.

Further, even in the case where the thickness of the layer containing a composite material is increased, increase in the drive voltage of the light emitting element can be suppressed. Accordingly, by increasing the film thickness of the layer containing a composite material, irregularities due to minute foreign bodies or the like on the substrate can be reduced, so that the light emitting region having a multiple quantum well structure can be formed over a flat layer in which irregularities are reduced. Thus, a multiple quantum well structure with fewer defects can be formed, the effects of the multiple quantum well structure can be exerted more effectively and a light emitting element with high luminous efficiency can be obtained.

Further, even in the case where the film thickness of the layer containing a composite material is increased, rise in drive voltage of the light emitting element can be suppressed. Accordingly, even if a layer containing a composite material is formed above a light emitting region having a multiple quantum well structure, rise in the drive voltage can be suppressed. Further, in the case of providing a layer containing a composite material in an upper position of the light emitting region, even when another electrode is formed by sputtering or the like, damage to the light emitting region can be reduced. Accordingly, even after forming the light emitting region having a multiple quantum well structure, damage in later manufacturing steps can be reduced, so that the multiple quantum well structure can be kept.

In addition, the layer containing the composite material, which is used for the light emitting element of the invention, can form an ohmic contact with the electrode, and has low contact resistance with the electrode. Therefore, the electrode material can be selected without considering the work function or the like. In other words, the electrode material can be selected from a wider range of materials.

Embodiment 2

In this embodiment, a light emitting region having a multiple quantum well structure in a light emitting element of the present invention will be described.

A light emitting region of a light emitting element of the invention has a multiple quantum well structure. Specifically, a material having high carrier transporting property, which is hardly crystallized (hereinafter referred to as a host material), and a material having high light emitting property (hereinafter referred to as a guest material) are combined to form the structure.

As the material having high carrier transporting property, for example, a silicon compound such as tetraphenylsilane or tetra(3-methylphenyl) silane, an anthracene derivative such as 9,10-diphenylanthracene or 9,10-di(2-naphthyl)anthracene, a bianthryl derivative such as 10,10'-diphenyl 9,9'-dianthracene, a pyrene derivative such as 1,3,6,8-tetraphenylpyrene, a carbazole derivative such as 4,4'-di(N-carbazolyl)biphenyl, an oxazole derivative such as 4,4'-bis (5-methylbenzoxazole-2-yl)stilbene, a stilbene derivative such as 4,4'-bis (2,2-diphenylethenyl)biphenyl can be used. Alternatively, a material having high electron transporting property may be used, for example, typical metal complexes such as tris(8-quinolinolato)aluminum (abbreviated as $Alq_3$), tris(4-methyl-8-quinolinolato)aluminum (abbreviated as $Almq_3$), bis (10-hydroxybenzo[h]-quinolinato)beryllium (abbreviated as $BeBq_2$), bis(2-methyl-8-quinolinolato)-(4-hydroxy-biphenylyl)-aluminum (abbreviated as BAlq), bis [2-(2-hydroxyphenyl)-benzoxazolato]zinc (abbreviated as $Zn(BOX)_2$), and bis[2-(2-hydroxyphenyl)-benzothiazolato] zinc (abbreviated as $Zn(BTZ)_2$) can be used. Further, a triazole derivative such as 3-(4-tert-butylphenyl)-4-(4-ethylphenyl)-5-(4-biphenylyl)-1,2,4-triazole, a phenanthroline derivative such as bathophenanthroline or bathocuproine may be used. Alternatively, a polymeric material such as poly(N-vinylcarbazole) or poly(phenylenevinylene) may be used.

Note that, the HOMO (highest occupied molecular orbital) level of the material having a high carrier transporting property is preferably lower than the HOMO level of a material having a high light emitting property, and the LUMO (lowest unoccupied molecular orbital) level of the material having a high carrier transporting property is preferably higher than the LUMO level of the material having a high light emitting property. For example, the HOMO level of the material having a high carrier transporting property is preferably from −5.3 eV to −6.0 eV, and the LUMO level is preferably from −2.0 eV to −2.6 eV.

As the material having a high light emitting property, either a fluorescent light emitting material or a phosphorescent light emitting material can be used. As the light emitting material, specifically, a coumarin derivative such as coumarin 6 or coumarin 545T, a quinacridone derivative such as N,N'-dimethyl quinacridone or an acridone derivative such as N,N'-diphenyl quinacridone, N-phenylacridone or N-methyl acridone, a condensed aromatic compound such as rubrene, 9,10-diphenylanthracene, or 2,5,8,11-tetra-t-butylperylene, a pyran derivative such as 4-dicyanomethylene-2-[p-(dimethylamino)styryl]6-methyl-4H-pyran, an amine derivative such as 4-(2,2-diphenylvinyl)triphenylamine can be used. As the phosphorescent light emitting material, an iridium complex such as bis {2-(4-tolyl)pyridinato}acetylacetonato iridium (III) or bis {2-(2'-benzothienyl)pyridinato}acetylacetonato iridium(III) can be used.

Note that, the HOMO (highest occupied molecular orbital) level of the material having a high light emitting property is preferably higher than the HOMO level of a material having a high carrier transporting property, and the LUMO (lowest unoccupied molecular orbital) level of the material having a high light emitting is preferably lower than the LUMO level of the material having a high carrier transporting property.

The material having a high light emitting property is added to the material having a high carrier transporting property so as to form a light emitting region. The light emitting region of the light emitting element of the invention has a multiple quantum well structure, in which a region containing higher concentration of the material having a high carrier transporting property than the concentration of the material having a high light emitting property and a region in which the material having a high light emitting property is dispersed in the material having a high carrier transporting property are alternately stacked. In other words, the concentration of the material having a high light emitting property periodically changes in the structure. Specifically, in the region in which the material having a high light emitting property is dispersed in the material having a high carrier transporting property, the material having a high light emitting property is added in the ratio of 0.001 wt % to 50 wt %, preferably, 0.03 wt % to 30 wt %.

Note that the region containing higher concentration of the material having a high carrier transporting property than the concentration of the material having a high light emitting property and the region in which the material having a high light emitting property is dispersed in the material having a high carrier transporting property are alternately stacked. The thickness of the respective region is preferably 20 nm or less, more preferably, 5 nm or less.

Alternatively, in spite of dispersing the material having a high light emitting property in the material having a high carrier transporting property, a region having higher concentration of the material having a high light emitting property than the concentration of the material having a high carrier transporting property may be formed. Specifically, a structure in which the region containing higher concentration of the material having a high light emitting property than the concentration of the material having a high carrier transporting property, and the region containing higher concentration of the material having a high carrier transporting property than the concentration of the material having a high light emitting property are alternately stacked may be used. Also in this case, the concentration of the material having a high light emitting property periodically changes in the structure.

The region containing higher concentration of the material having a high carrier transporting property than the concentration of the material having a high light emitting property and the region containing higher concentration of the material having a high light emitting property than the concentration of the material having a high carrier transporting property are alternately stacked. Each of the regions has a thickness of 20 nm or less, more preferably, 5 nm or less.

Here, as the combination of the material having a high carrier transporting property and the material having a high light emitting property, it is necessary that the HOMO (highest occupied molecular orbital) level of the material having a high light emitting property is higher than the HOMO level of a material having a high carrier transporting property, and the LUMO (lowest unoccupied molecular orbital) level of the material having a high light emitting is lower than the LUMO level of the material having a high carrier transporting property. When this condition is satisfied, the multiple quantum well structure can be formed.

Further, when a phosphorescent light emitting material is used for the material having a high light emitting property, the triplet level of the phosphorescent light emitting material is required to be lower than the triplet level of the material having a high carrier transporting property.

Further, it is preferable that the region of the wavelengths of the light emission of the material having a high carrier transporting property overlaps the region of the wavelengths of the absorption of the material having a high light emitting property. In particular, when the overlap between the region of the wavelengths of the light emission of the material having a high carrier transporting property and the region of the wavelengths of the absorption of the material having a high light emitting property is large, energy transfers more efficiently from the material having a high carrier transporting property to the material having a high light emitting property, which is preferable Embodiment 3

A vapor deposition apparatus used for implementing the present invention and a method of manufacturing a light emitting region having a multiple quantum well structure using the vapor deposition apparatus with reference to FIGS. 12 to 15.

Figure 15:
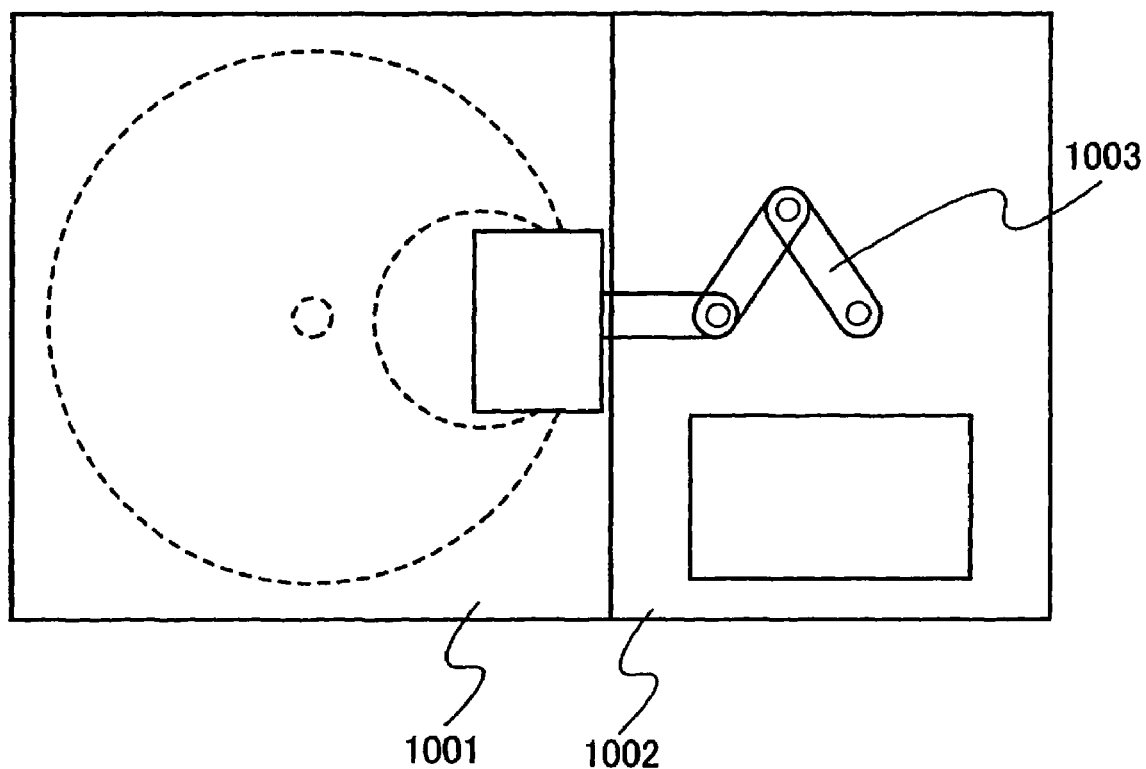
FIG. 15 is a diagram for explaining a method of manufacturing a light emitting element of the present invention.

In the vapor deposition apparatus used in this embodiment, a treatment chamber 1001 in which an object is subjected to vapor deposition and a transferring chamber 1002 are provided. The object is transferred to the treatment chamber 1001 through the transferring chamber 1002. The transferring chamber 1002 is provided with an arm 1003 for carrying the object (FIG. 15).

Figure 12:
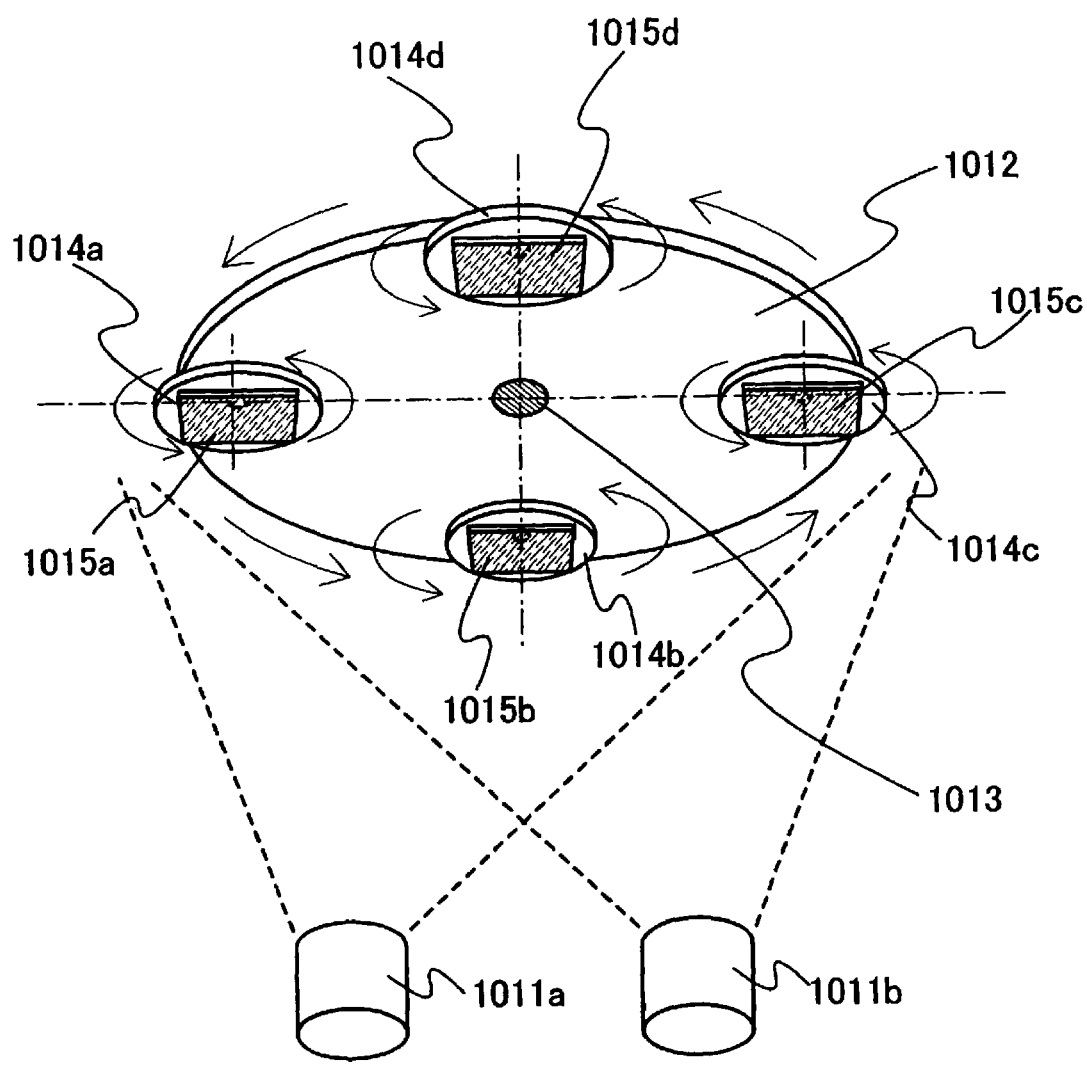
FIG. 12 is a diagram for explaining a method of manufacturing a light emitting element of the present invention.

As shown in FIG. 12, in the treatment chamber 1001, a holder for fixing an object, an evaporation source 1011a filled with a first material, and an evaporation source 1011b filled with a second material are provided. In FIG. 12, the holder for holding an object includes a first rotating plate 1012, which rotates around an axis 1013, and a plurality of second rotating plates 1014a to 1014d provided on the first rotating plate 1012. The second rotating plates 1014a to 1014d are independently rotated around axes, which are provided for each of the second rotating plates separately from the axis 1013. Objects 1015a to 1015d are provided on the second rotating plates 1014a to 1014d.

In FIG. 12, the object 1015a is held on the second rotating plate 1014a, the object 1015b is held on the second rotating plate 1014b, the object 1015c is held on the second rotating plate 1014c, and the object 1015d is held on the second rotating plate 1014d.

The light emitting region is formed as follows. First, the material filling the evaporation sources 1011a and 1011b are sublimated by heating. Further, the first rotating plate 1012 and the second rotating plates 1014a to 1014d holding the objects are rotated. As shown in FIG. 12, when the distance between the object 1015a and the evaporation source 1011a is shorter than the distance between the object 1015a and the evaporation source 1011b, each material is deposited on the object 1015a so that the concentration of the first material is higher than that of the second material. On the other hand, when a distance between the object 1015c and the evaporation source 1011b is shorter than a distance between the object 1015c and the evaporation source 1011a, each material is deposited on the object 1015c so that the concentration of the second material is higher than that of the first material.

Next, if the position of the second rotating plate 1014a inside the treatment chamber 1001 is changed by the rotation of the first rotating plate 1012, the object 1015a is held at the position of the second rotating plate 1014c of FIG. 12, and the distance between the object 1015a and the evaporation source 1011b becomes shorter than the distance between the object 1015a and the evaporation source 1011a. In this case, each material is deposited on the object 1015a so that the concentration of the second material is higher than that of the first material.

In this manner, by changing the positions of the objects 1015a to 1015d with respect to the evaporation sources 1011a and 1011b, a light emitting region which has a plurality of regions each having different concentration ratios of materials can be formed on the objects 1015a to 1015d. Here, the thickness of each region in the stacked direction (e.g., thickness direction) included in the layer containing a composite material (length of one cycle of the periodic change in the concentration ratio) may be appropriately changed by controlling the rotation rate of the first rotating plate 1012 and the like.

For example, when the rotation rate of the first rotating plate 1012 is increased, one cycle of the periodic change in the concentration ratio of the first material to the second material becomes shorter.

In addition, by fixing the rotation rate of the first rotating plate 102 while increasing the rates of deposition from the evaporation source 1011a and the evaporation source 1011b, one cycle of the periodic change in the concentration ratio of the first material to the second material can be made longer.

Thus, by using a vapor deposition apparatus described in this embodiment, and for example, by using a material having a high light emitting property as the first material and a material having a high carrier transporting property as the second material, a light emitting region having a multiple quantum well structure, which contains a material having a high light emitting property and a material having a high carrier transporting property can be formed.

Further, in the case of forming a multiple quantum well structure, a method in which a shutter between the evaporation source and an object is opened or closed to form each region is conceived. However, the multiple quantum well structure can be formed more easily by using a method according to the invention. Consequently, a light emitting element having a multiple quantum well structure can be manufactured with high throughput.

Note that in the structure shown in FIG. 12, each of the first rotating plate and the second rotating plate may be independently rotated. For example, the vapor deposition may be carried out while rotating only the first plate.

The shapes of the first rotating plate 1012 and the second rotating plates 1014a to 1014d are not specifically limited, and polygons such as a quadrangle may be employed other than a circular shape as shown in FIG. 12. In addition, although the second rotating plates 1014a to 1014d are not necessarily required, the provision of the second rotating plates 1014a to 1014d will reduce variations in the thickness of a layer formed on the object, and the like.

Figure 13:
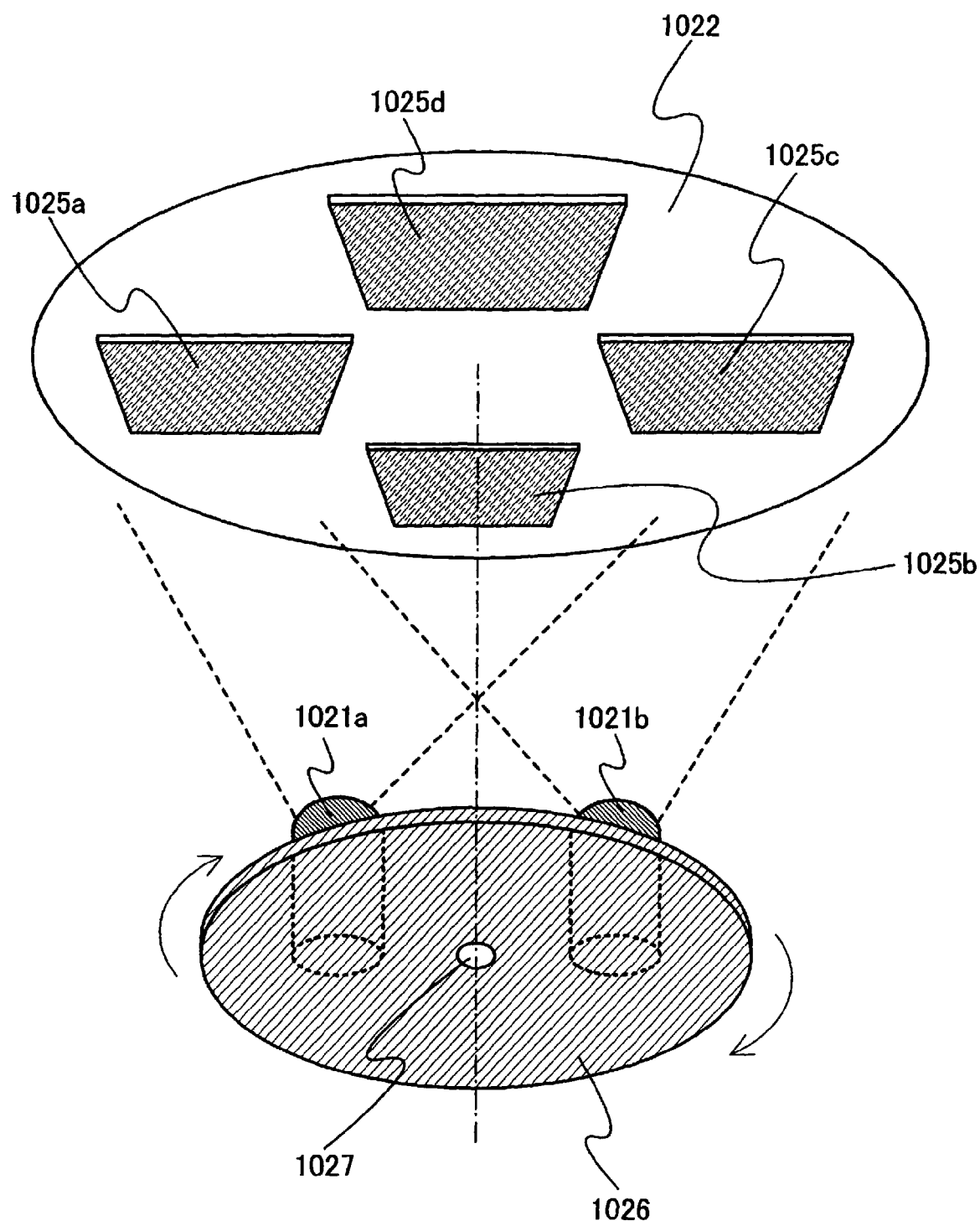
FIG. 13 is a diagram for explaining a method of manufacturing a light emitting element of the present invention.

The structure of the treatment chamber 1001 is not limited to the one shown in FIG. 12, and for example, the structure as shown in FIG. 13 may be employed, where the position of each evaporation source can be changed.

In FIG. 13, evaporation sources 1021a and 1021b are fixed, and a rotating plate 1026 which rotates around an axis 1027 as a center is provided opposite to face a holder 1022 for holding objects. The holder 1022 holds objects 1025a to 1025d. The evaporation source 1021a holds a first material, while the evaporation source 1021b holds a second material. When each evaporation source is located such that the evaporation source 1021a is closer to the object 1025a than the evaporation source 1021b is, each material is deposited onto the object 1025a in such a manner that the first material has a higher concentration than the second material. When the rotating plate 1026 is rotated to set the evaporation source 1021b to be closer to the object 1025a than the evaporation source 1021a is, each material is deposited on the object 1025a in such a manner that the second material has a higher concentration than the first material. In this manner, the vapor deposition apparatus may have a structure in which the position of each evaporation source with respect to the object is changed by changing the position of the evaporation sources. That is, the evaporation sources and the objects may be provided so that each position changes relative to each other.

In the structure of FIG. 13, when the rotation rates of the evaporation source 1021a and the evaporation source 1021b are increased, one cycle of the periodic change in the concentration ratio of the first material to the second material becomes shorter. In other words, one cycle of the periodic change in the concentration ratio of the material having high light emitting property and a material having high carrier transporting property which are contained in the light emitting region becomes shorter.

Figure 14:
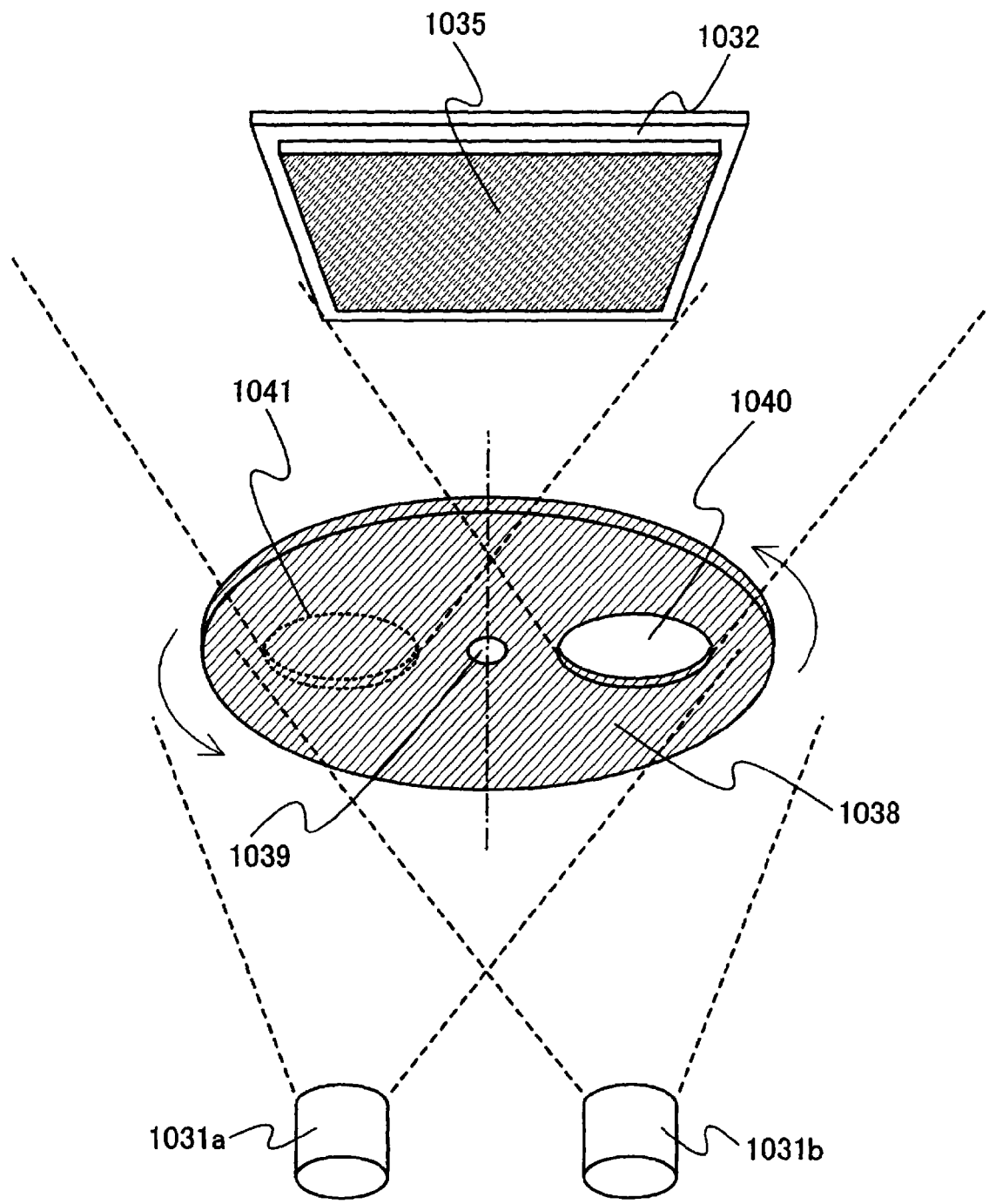
FIG. 14 is a diagram for explaining a method of manufacturing a light emitting element of the present invention.

Instead of the structures shown in FIG. 12 and FIG. 13, a structure as shown in FIG. 14 may be employed, where a rotating plate having an opening is provided between evaporation sources and a holder, and the position of the opening of the rotating plate is changed.

In FIG. 14, an evaporation source 1031a for holding a first material and an evaporation source 1031b for holding a second material are provided opposite to a holder 1032 with a rotating plate 1038 having an opening 1040 sandwiched therebetween. The rotating plate 1038 rotates around an axis 1039 as a center so that the position of the opening 1040 changes by the rotation. When the opening 1040 is positioned closer to the evaporation source 1031a than the evaporation source 1031b, gas is diffused in the direction from the holder 1032 to the opening 1040 in a state where the first material has higher concentration than the second material, thereby each material is deposited on an object 1035 held by the holder 1032 so that the first material has a higher concentration than the second material. When the rotating plate 1038 is rotated to set the opening 1040 to be closer to the evaporation source 1031b than the evaporation source 1031a (e.g., if the opening is set as indicated by a dashed line 1041), each material is deposited on the object 1035 in such a manner that the second material has higher concentration than the first material.

In the structure shown in FIG. 14, when the rotation rate of the rotating plate 1038 is increased, one cycle of the periodic change in the concentration ratio of the first material to the second material becomes shorter. In other words, one cycle of the periodic change in the concentration ratio of the material having high light emitting property and a material having high carrier transporting property which are contained in the light emitting region becomes shorter.

In this manner, by changing the positions of the evaporation sources and the object relatively to each other, a layer containing a composite material can be formed. In addition to the evaporation sources, by changing the relative positions of the object and the opening provided in the rotating plate functioning as a mask relatively to each other, a layer containing a composite material can be formed.

Note that the structure of the vapor deposition apparatus is not limited to the one shown in FIG. 15, and for example, a structure having a sealing chamber for sealing a light-emitting element may be employed. Further, the number of the treatment chambers for performing vapor deposition is not required to be one, and two or more treatment chambers may be provided.

Figure 16A:
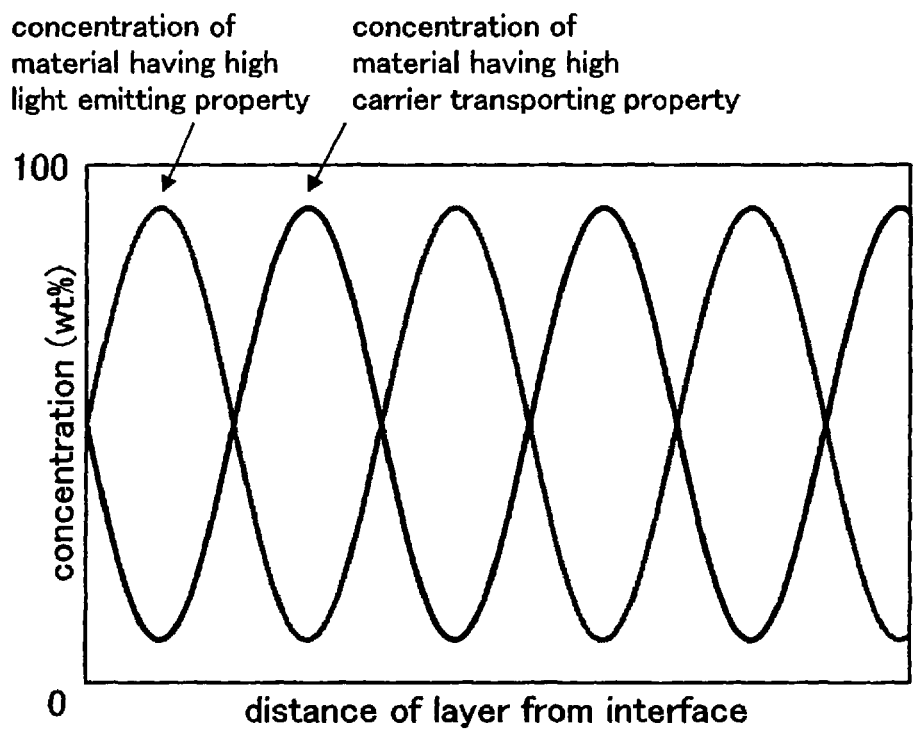
FIGS. 16A and 16B are diagrams for explaining a light emitting element of the present invention.

Note that, the deposition rates of the evaporation source may be the same or different in the cases of using the first material and the second material. For example, the deposition rate of the material having a high carrier transporting property and the deposition rate of the material having a high light emitting property are made almost the same. In this case, as shown in FIG. 16A, the region containing higher concentration of the material having a high carrier transporting property than the concentration of the material having a high light emitting property and a region in which the material having a higher light emitting property than the concentration of the material having a high carrier transporting property are alternately stacked.

Figure 16B:
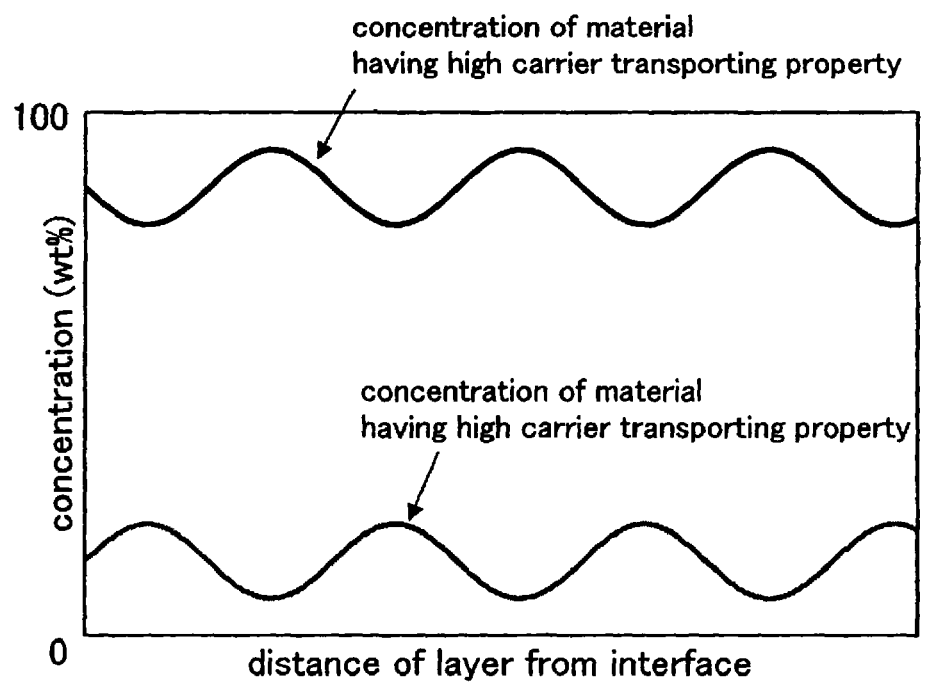

Alternatively, the deposition rate of the material having a high carrier transporting property may be increased, and that of the material having a high light emitting property is decreased. In this case, as shown in FIG. 16B, a region containing a higher concentration of the material having a high carrier transporting property than the concentration of the material having a high light emitting property and a region in which a material having a higher light emitting property is dispersed in a material having a high carrier transporting property are alternately stacked.

Note that one cycle of the periodic change in the concentration ratio differs depending on the distance between the substrate and the evaporation sources, the distance between evaporation sources, the distance between the substrate and the rotation axis, and the like as well as the rotation rate of the substrate and the deposition rate; therefore, the optimal value may be set appropriately for each apparatus. Note that, depending on the size of the substrate, the distance between the evaporation sources is preferably about twice the distance between the center of the substrate and the rotation axis. For example, in the case of using a 12 cm×12 cm substrate, when the distance between the substrate and the evaporation source is set at 20 cm to 40 cm, the distance between the evaporation source and the evaporation source: 15 cm to 30 cm, the distance between the center of the substrate rotation axis: 8 cm to 15 cm, the deposition rate: 0.2 to 2.0 nm/s, and the rotation rate: 4 rpm to 12 rpm, thereby a multiple quantum well structure can be formed.

Embodiment 4

In this embodiment, a light emitting element of the present invention will be described.

A light emitting element of the invention has a plurality of layers between a pair of electrodes. The plurality of layers are formed by stacking layers each formed of a material having a high carrier injection property or a high carrier transporting property so that a light emitting region is provided away from the electrodes, that is, carriers are recombined in a portion away from the electrodes. Further, the light emitting element of the invention has a multiple quantum well structure in the light emitting region.

One mode of the light emitting element of the invention will be described with reference to FIG. 1A.

In this embodiment, the light emitting element is formed by stacking a first electrode 102, a first layer 103, a second layer 104, a third layer 105, a fourth layer 106, and a second electrode 107 in this order. Note that in this embodiment, description will be made below as the first electrode 102 functions as an anode while the second electrode 107 functions as a cathode.

A substrate 101 is used as a support of the light emitting element. The substrate 101 may be formed using glass, plastic or the like, for example. Note that another material may be used as long as it can function as a support of the light emitting element in the manufacturing process.

The first electrode 102 may be formed by using various metals, alloys, electrically conductive compounds, or a mixture of such materials. For example, the first electrode 102 may be formed by using indium tin oxide (ITO); indium tin oxide containing silicon; IZO (Indium Zinc Oxide) obtained by mixing indium oxide with 2 to 20 wt % of zinc oxide (ZnO); indium oxide containing 0.5 to 5 wt % of tungsten oxide and 0.1 to 1 wt % of zinc oxide (IWZO); or the like.

Although these conductive metal oxide films are generally formed by sputtering, it may be formed by applying a sol-gel method or the like. Alternatively, the first electrode 102 may be formed by using gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), nitride of a metal material such as TiN, or the like. Note the in the case of using the first electrode as a reflective electrode, and extracting light from the second electrode, the first electrode is preferably formed of a material having high reflectivity, for example, aluminum (Al), aluminum-silicon (Al—Si), or aluminum-titanium (Al—Ti) is preferably used.

The first layer 103 is a layer containing a composite material shown in Embodiment 1. Specifically, the first layer 103 is a layer containing an organic compound and an inorganic compound.

The second layer 104 is a layer formed of a material having a high hole transporting property, specifically, an aromatic amine compound (i.e., having benzene ring-nitrogen bonds) is preferable. For example, a starburst aromatic amine compound such as 4,4'-bis[N-(3-methylphenyl)-N-phenyl-amino]-biphenyl; a derivative thereof: 4,4'-bis[N-(1-naphthyl)-N-phenylamino]biphenyl (abbreviated as NPB); 4,4', 4"-tris(N,N-diphenyl-amino)-triphenylamine; or 4,4',4"-tris[N-(3-methylphenyl)-N-phenyl-amino]-triphenylamine can be used. Each substance described herein mainly has a hole mobility of $10^{-6}$ cm$^2$/Vs or higher. Note that other materials may be used as long as they have a hole transporting property higher than an electron transporting property. Note that the second layer 104 is not limited to a single layer, but may be a stack having two or more layers formed of the aforementioned materials.

The third layer 105 is a light emitting region having a multiple quantum well structure described in Embodiment 2. Specifically, a material which has high carrier transporting property and is hardly crystallized, and a material having high light emitting property are combined to form the structure.

The fourth layer 106 is a layer having a high electron transporting property, for example, a metal complex having a quinoline skeleton or a benzoquinoline skeleton such as tris (8-quinolinolato) aluminum (abbreviated as Alq$_3$); tris(4-methyl-8-quinolinolato)aluminum (abbreviated as Almq$_3$); bis (10-hydroxybenzo[h]quinolinato)beryllium (abbreviated as BeBq$_2$); or bis(2-methyl-8-quinolinolato)(4-hydroxy-biphenyl)aluminum (abbreviated as BAlq), a typical metal complex having an oxazole ligand or a thiazole ligand may be used such as bis[2-(2'-hydroxyphenyl)benzoxazolato]zinc (abbreviated as Zn(BOX)$_2$); or bis[2-(2'-hydroxyphenyl)benzothiazolato]zinc (abbreviated as Zn(BTZ)$_2$). A hydrocarbon compound such as 9,10-diphenylanthracene or 4,4'-bis (2,2-diphenylethenyl)biphenyl is also favorable. Alternatively, other than such metal complex, the following can be used: 2-(4-biphenyl)-5-(4-tert-butylphenyl)-1,3,4-oxadiazole (abbreviated as PBD); 1,3-bis[5-(4-tert-butylphenyl)-1,3,4-oxadiazol-2-yl]benzene (abbreviated as OXD-7); 3-(4-biphenylyl)-4-phenyl-5-(4-tert-butylphenyl)-1,2,4-triazole (abbreviated as TAZ); 3-(4-biphenylyl)-4-(4-ethylphenyl)-5-(4-tert-butylphenyl)-1,2,4-triazole (abbreviated as p-Et-TAZ); bathophenanthroline (abbreviated as BPhen); bathocuproine (abbreviated as BCP); or the like. Each material described herein mainly has an electron mobility of $10^{-6}$ cm$^2$/Vs or higher. Note that another material may be used as long as they have an electron transporting property higher than a hole transporting property. Note that the fourth layer 106 is not limited to a single layer, but may be a stack having two or more layers formed of the aforementioned substances.

The second electrode 107 may be formed of a material having a low work function (3.8 eV or lower) such as a metal, an alloy, an electrically conductive compound, or a mixture of them. As a specific example of such a cathode material, there are metals belonging to the group 1 or 2 of the periodic table, namely alkali metals such as lithium (Li) or cesium (Cs), alkaline earth metals such as magnesium (Mg), calcium (Ca), or strontium (Sr), alloys containing such metals (MgAg or AlLi), a rare earth metals such as europium (Eu) or ytterbium (Yb) or alloys or the like containing these. However, by providing a layer having a function to promote electron injection on the second electrode 107 so as to be located between the second electrode 107 and the fourth layer 106, various conductive materials such as Al, Ag, ITO, or ITO containing silicon can be used for the second electrode 107 regardless of the value of the work function.

Note that the layer having a function to promote electron injection includes a compound of alkali metals such as lithium fluoride (LiF) or cesium fluoride (CsF) or a compound of alkaline earth metals such as calcium fluoride (CaF$_2$). Alternatively, the second electrode 107 may be formed from a layer formed of a material having an electron transporting property into which an alkali metal or an alkaline earth metal is mixed, for example, Alq$_3$ in which magnesium (Mg) is mixed may be used.

The second layer 104 and the fourth layer 106 may be formed by a known method such as vapor deposition, an ink-jet method, or spin coating. In addition, different vapor deposition methods may be used for forming the respective electrodes or layers. Note that the third layer 105 is preferably formed by a method described in Embodiment 3.

In the light emitting element of the invention which has the aforementioned structure, current flows in accordance with a potential difference generated between the first electrode 102 and the second electrode 107, thereby holes and electrons are recombined in the third layer 105 which is a layer containing a material having a high light emitting property; thus, light emission is obtained. In other words, a light emitting region is formed in the third layer 105.

Figure 11A:
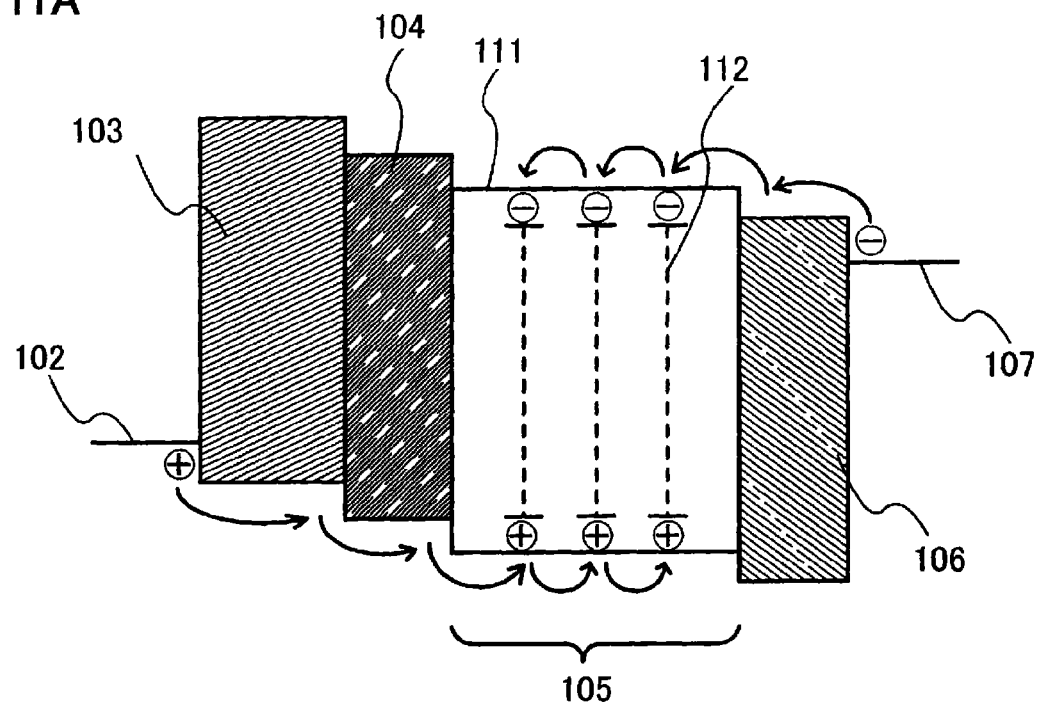
FIGS. 11A and 11B are diagrams for explaining a light emitting element of the present invention.
Figure 11B:
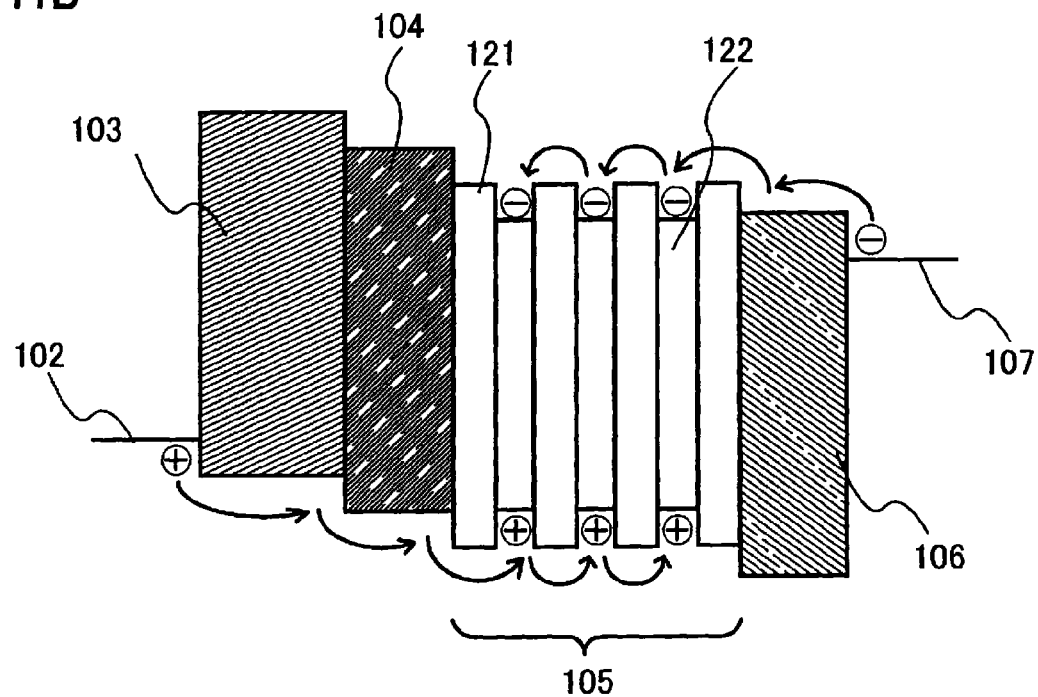

The energy level of a light emitting element of the invention will be described in more detail. FIGS. 11A and 11B are schematic diagrams showing the energy level of the light emitting element of the invention shown in FIGS. 1A to 1C. In FIGS. 11A and 11B, holes injected from the first electrode 102 are transported to the third layer 105 which is a light emitting region through a composite material having the first layer 103 and the second layer 104 containing a material having a high hole transporting property as shown in Embodiment 1. Electrons injected from the second electrode 107 are transported to the third layer 105 which is the light emitting region through the fourth layer 106 containing a material having high electron transporting property. In the third layer 105, holes and electrons are recombined to emit light. The third layer 105 has a multiple quantum well structure and contains a material having a high light emitting property and a material having a high carrier transporting property as shown in Embodiment 2.

FIG. 11A shows a structure in which a region containing higher concentration of a material having a high carrier transporting property than a concentration of a material having a high light emitting property and a region in which a material having a high light emitting property is dispersed in a material having a high carrier transporting property are alternately stacked. In FIG. 11A, the region containing higher concentration of a material having a high carrier transporting property than a concentration of a material having a high light emitting property functions as a partition wall 111, and the region in which the material having a high light emitting property is dispersed serves as a well 112. Holes injected into the third layer 105, which is a light emitting region, enter the region containing high concentration of a material having a light emitting property (well), and are recombined with electrons. Holes which have penetrated the first well enter a second well and are recombined with electrons. When a multitude of wells are formed, holes are trapped in the wells, and the probability of recombination with electrons is improved. This also applies to electrons; electrons enter a region containing high concentration of a material having a high light emitting property (well), and are combined with holes. Electrons which have penetrated the first well enter a second well and are recombined with holes. When a multitude of wells are formed, the holes are trapped in the wells, and the probability of recombination with holes is improved. Thus, the probability of recombination of holes and electrons is improved, thereby the luminous efficiency is improved.

FIG. 11B shows a structure in which a region containing higher concentration of a material having a high carrier transporting property than a concentration of a material having a high light emitting property and a region containing higher concentration of a material having a high light emitting property than a concentration of a material having a high carrier transporting property are alternately stacked. As in FIG. 11A, the region containing higher concentration of a material having a high carrier transporting property than a concentration of a material having a high light emitting property functions as a partition wall 121, and the region containing higher concentration of the material having a high light emitting property than the concentration of the material having a high carrier transporting property serves as a well 122. Accordingly, holes injected into the third layer 105, which is a light emitting region, enter the region containing high concentration of a material having a high light emitting property (well), and are recombined with electrons. Holes which have penetrated the first well enter a second well and are recombined with electrons. When a multitude of wells are formed, holes are trapped in the wells, and the probability of recombination with electrons is improved. This also applies to electrons; electrons enter a region containing high concentration of a material having a high light emitting property (well), and are combined with holes. Electrons which have penetrated the first well enter a second well and are recombined with holes. When a multitude of wells are formed, the holes are trapped in the wells, and the probability of recombination with holes is improved. Thus, the probability of recombination of holes and electrons is improved, thereby the luminous efficiency is improved.

Figure 1B:
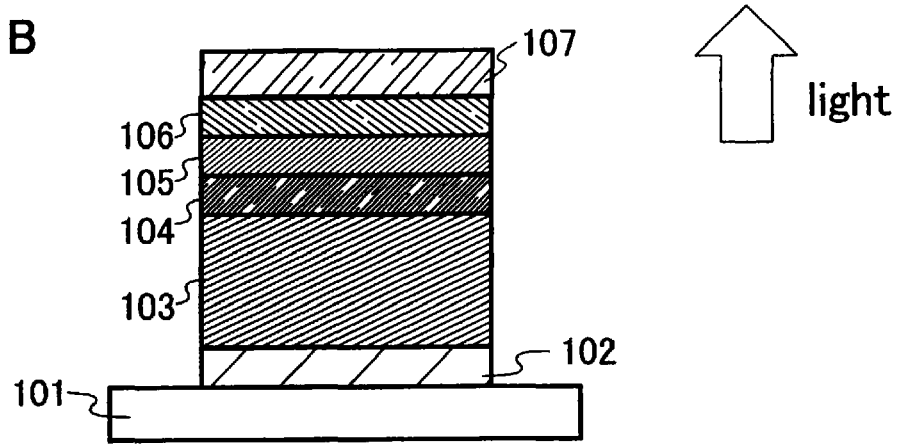
Figure 1C:
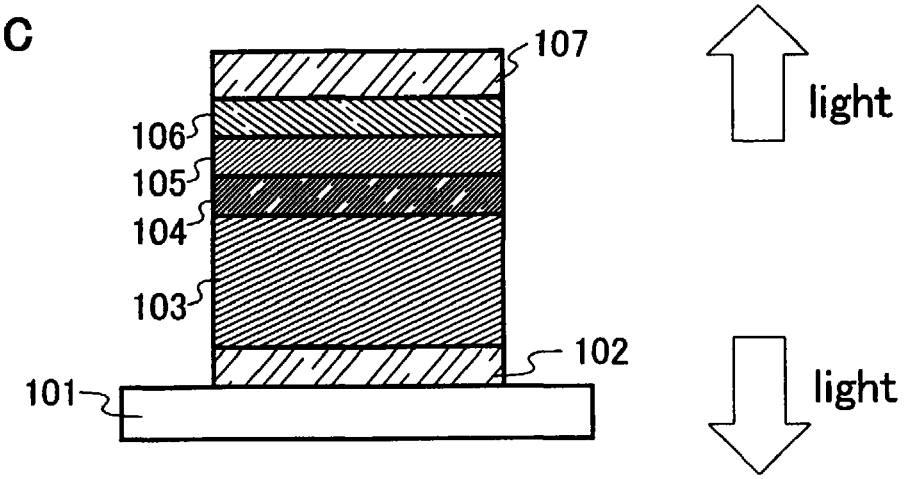

Light is extracted to the outside through one or both of the first electrode 102 and the second electrode 107. Accordingly, one or both of the first electrode 102 and the second electrode 107 is formed of a light-transmitting substance. In the case where only the first electrode 102 is formed of a light-transmitting substance, light is emitted from the substrate side through the first electrode 102 as shown in FIG. 1A. Alternatively, in the case where only the second electrode 107 is formed of a light-transmitting substance, light is emitted from the opposite side of the substrate through the second electrode 107 as shown in FIG. 1B. Further alternatively, in the case where both the first electrode 102 and the second electrode 107 are formed of a light-transmitting substance, light is emitted from both the substrate side and the opposite side of the substrate through the first electrode 102 and the second electrode 107 as shown in FIG. 1C.

Note that the structure of the layers provided between the first electrode 102 and the second electrode 107 is not limited to the above. Any other structure may be employed as long as a light emitting region having a multiple quantum well structure in which holes and electrodes are recombined is provided away from the first electrode 102 and the second electrode 107 in order to prevent light quenching which would be caused when the light emitting region is located close to a metal, and a layer containing a composite material of the invention is provided between an electrode and the light emitting region.

In other words, the stacked structure of the layers is not specifically limited, and a layer containing a composite material of the invention may be freely combined with a layer formed of a substance with a high electron transporting property, a material having a high hole transporting property, a material having a high electron injecting property, a material having a high hole injecting property, a substance having a bipolar property (material having both a high electron transporting property and a high hole transporting property), and the like. In addition, a layer formed of a silicon oxide film or the like may be provided over the first electrode 102 to control a portion where carriers are recombined.

Figure 2:
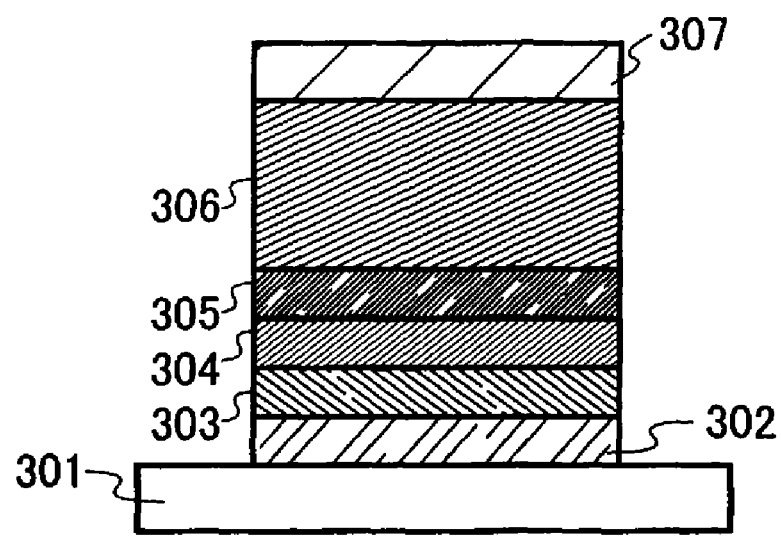
FIG. 2 is a diagram for explaining a light emitting element of the present invention.

The light emitting element shown in FIG. 2 has a structure in which a first electrode 302 functioning as a cathode, a first layer 303 formed of a material having a high electron transporting property, a second layer 304 containing a material having a high light emitting property, a third layer 305 with a high hole transporting property, a fourth layer 306 as a layer containing a composite material of the invention, and a second electrode 307 functioning as an anode are stacked in this order. Note that reference numeral 301 denotes a substrate.

In this embodiment, a light emitting element is formed over a substrate made of glass, plastic or the like. By forming a plurality of such light emitting elements over one substrate, a passive matrix light emitting device can be manufactured. Alternatively, the light emitting elements may be formed over a substrate having a thin film transistor (TFT) array instead of the aforementioned substrate made of glass, plastic or the like. Accordingly, an active matrix light emitting device can be manufactured, where drive of light emitting elements is controlled by TFTs. Note that the structure of each TFT is not specifically limited. It may be a staggered TFT or an inverted staggered TFT. As for a driver circuit formed on the TFT array substrate also, one or both of n-channel transistors and p-channel transistors may be used.

Since the layer containing a composite material of the invention has high conductivity in the stacked direction, rise in the drive voltage can be suppressed even when the layer containing a composite material is formed thick.

Further, as to a light emitting element of the invention, in the case where the thickness of the layer containing a composite material is increased, increase in the drive voltage of the light emitting element can be suppressed. Accordingly, by increasing the film thickness of the layer containing a composite material, irregularities due to minute foreign bodies or the like on the substrate can be reduced, so that the light emitting region having a multiple quantum well structure can be formed over a layer in which irregularities are reduced. Thus, a multiple quantum well structure with fewer defects can be formed, the effects of the multiple quantum well structure can be exerted and a light emitting element with high luminous efficiency can be obtained.

Further, a composite material used in the present invention can suppress rise in the drive voltage even in the case of thickening the film thicknesses; thus, the film thickens of the layer containing the composite material can be optimized so that the extraction efficiency of light emitted outward is increased while suppressing rise in the drive voltage.

Further, optical design can be made easier by controlling the film thickness of the layer containing a composite material without increasing the drive voltage; thus, the color purity of emitted light can be improved.

Further, since the increased thickness of the layer containing a composite material can prevent short circuit due to minute foreign bodies, external shocks, and the like, a light emitting element with high reliability can be obtained. For example, layers between a pair of electrodes of a general light emitting element have a thickness of 100 to 150 nm; meanwhile, layers (including a layer containing a composite material) between a pair of electrodes of a light emitting element of the invention can be formed to have a thickness of 100 to 500 nm, preferably, 200 to 500 nm.

A layer containing a composite material which is used for a light emitting element of the invention is capable of forming an ohmic contact with an electrode; therefore, contact resistance with the electrode is low. Thus, electrode materials can be selected without considering the work function or the like. Accordingly, the selection range of the electrode materials can be widened.

Embodiment 5

In this embodiment, a light emitting element having a different structure than that shown in Embodiment 4 will be described with reference to FIGS. 5A to 5C and FIGS. 6A to 6C. In the structure shown in this embodiment, a layer containing a composite material of the invention can be provided so as to contact an electrode functioning as a cathode.

Figure 5A:
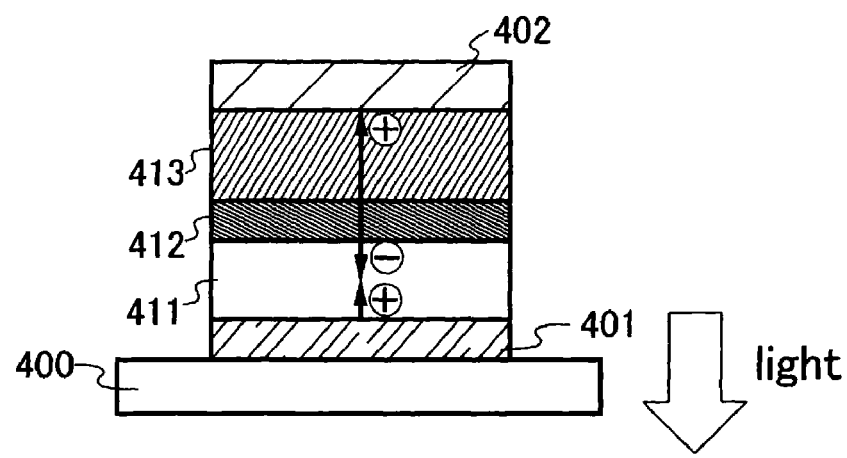
FIGS. 5A to 5C are diagrams for explaining a light emitting element of the present invention.

FIG. 5A shows an example of a structure of the light emitting element of the invention. A first layer 411, a second layer 412, and a third layer 413 are stacked in this order, which are sandwiched between a first electrode 401 and a second electrode 402. This embodiment will describe the case where the first electrode 401 functions as an anode while the second electrode 402 functions as a cathode.

The first electrode 401 and the second electrode 402 may have the same structure as that of Embodiment 4. In addition, the first layer 411 is a layer containing a material having a high light emitting property and a material having a high carrier transporting property. Specifically, a structure described in Embodiment 2 can be applied. Further, the first layer 411 may also have a material having a high hole injecting property, a material having a high hole transporting property, a material having a high electron transporting property, or the like. The second layer 412 is a layer containing a compound selected from among electron-donating substances and also containing a material having a high electron transporting property, while the third layer 413 is a layer containing a composite material shown in Embodiment 1. An electron-donating substance contained in the second layer 412 is preferably an alkali metal, an alkaline earth metal, or an oxide or a salt thereof. Specifically, lithium, cesium, calcium, lithium oxide, calcium oxide, barium oxide, cesium carbonate, or the like can be used.

With such a structure, electrons are donated/accepted in the vicinity of the interface between the second layer 412 and the third layer 413 by applying a voltage as shown in FIG. 5A; thus, electrons and holes are generated. At this time, the second layer 412 transports electrons to the first layer 411 while the third layer 413 transports holes to the second electrode 402. Accordingly, the second layer 412 and the third layer 413 collectively function as a carrier generating layer. In addition, the third layer 413 also has a function to transport holes to the second electrode 402.

Since the drive voltage can be prevented from increasing even if the third layer 413 is formed thick, the thickness of the third layer 413 can be freely set and the extraction efficiency of light emitted from the first layer 411 can be improved. In addition, the thickness of the third layer 413 may be set so as to improve the color purity of light emitted from the first layer 411.

Further, the thickened third layer 413 can prevent short circuit due to minute foreign bodies, external shocks, and the like.

When taking FIG. 5A for instance, if the second electrode 402 is deposited by sputtering, damages caused to the first layer 411 which is a light emitting region having a multiple quantum well structure can be decreased.

Note that the light emitting element of this embodiment may also have a variety of structures by changing the materials of the first electrode 401 and the second electrode 402. FIGS. 5B and 5C and FIGS. 6A to 6C show the schematic views thereof. Note that the same reference numerals as those in FIG. 5A are used in FIGS. 5B and 5C and FIGS. 6A to 6C. Reference numeral 400 denotes a substrate for supporting the light emitting element of the invention.

Figure 5B:
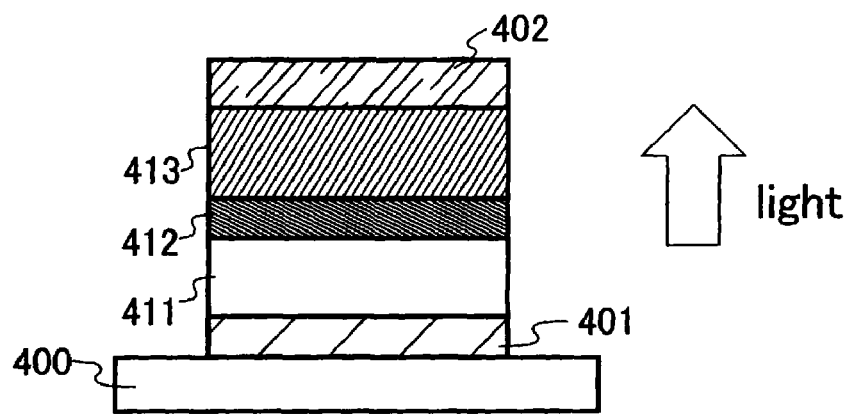
Figure 5C:
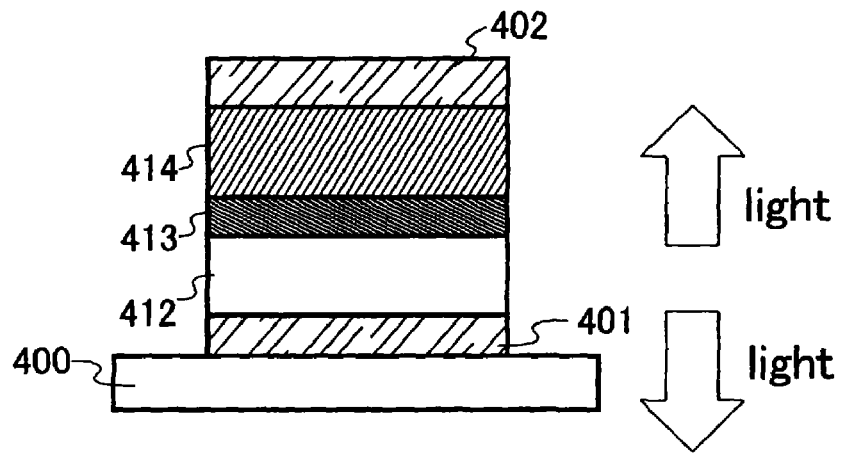

FIGS. 5A to 5C show examples where the first layer 411, the second layer 412, and the third layer 413 are formed in this order over the substrate 400. When forming the first electrode 401 to transmit light, and forming the second electrode 402 to shield light (reflect light, in particular), light can be emitted from the substrate 400 side as shown in FIG. 5A. When forming the first electrode 401 to shield light (reflect light, in particular), and forming the second electrode 402 to transmit light, light can be emitted from the opposite side of the substrate 400 as shown in FIG. 5B. Further, when forming both of the first electrode 401 and the second electrode 402 to transmit light, light can be emitted from both of the substrate 400 side and the opposite side thereof as shown in FIG. 5C.

Figure 6A:
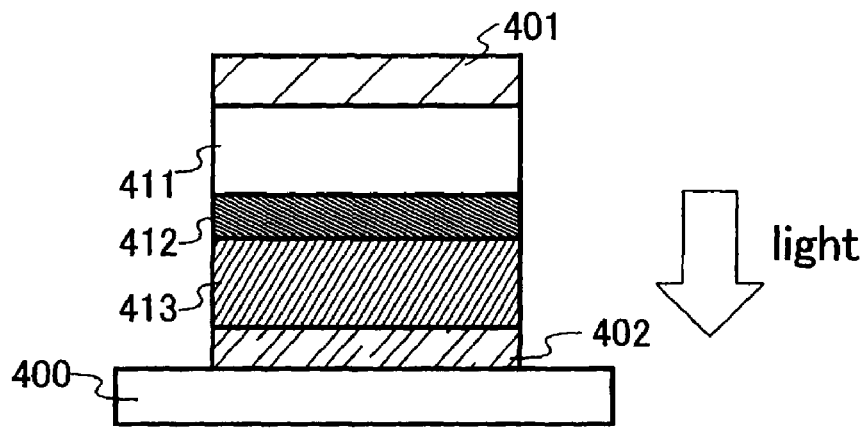
FIGS. 6A to 6C are diagrams for explaining a light emitting element of the present invention.
Figure 6B:
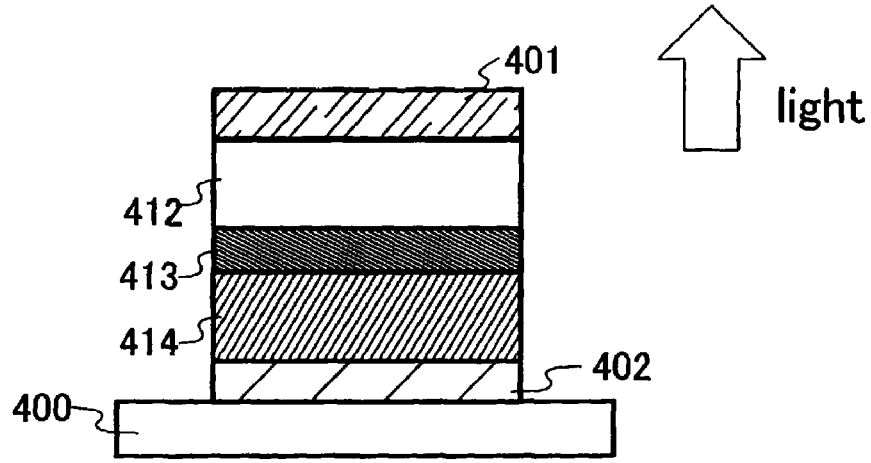
Figure 6C:
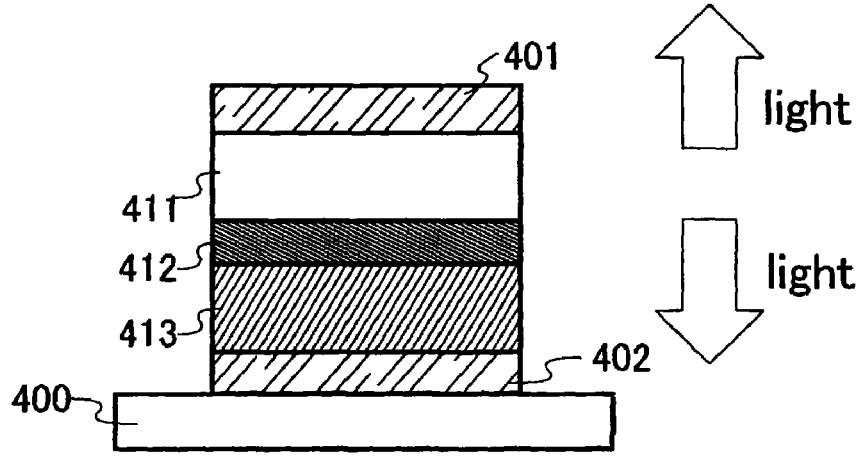

FIGS. 6A to 6C show examples where the third layer 413, the second layer 412 and the first layer 411 are formed in this order over the substrate 400. When forming the first electrode 401 to shield light (reflect light, in particular), and forming the second electrode 402 to transmit light, light can be emitted from the substrate 400 side as shown in FIG. 6A. When forming the first electrode 401 to transmit light, and forming the second electrode 402 to shield light (reflect light, in particular), light can be emitted from the opposite side of the substrate 400 as shown in FIG. 6B. Further, when forming both of the first electrode 401 and the second electrode 402 to transmit light, light can be emitted from both of the substrate 400 side and the opposite side thereof as shown in FIG. 6C.

Note that the light emitting element in this embodiment can be manufactured by a known method without being limited to a wet method process or a dry process. However, the layer containing a material having a high light emitting property and a material having a high carrier transporting property is preferably formed by the method shown in Embodiment 3.

In addition, the light emitting element may be formed either in a manner shown in FIGS. 5A to 5C where the first electrode 401, the first layer 411, the second layer 412, the third layer 413, and the second electrode 402 are stacked in this order, or in a manner shown in FIGS. 6A to 6C where the second electrode 402, the third layer 413, the second layer 412, the first layer 411, and the first electrode 401 are stacked in this order.

Note that this embodiment can be appropriately combined with other embodiments.

Embodiment 6

In this embodiment, a light emitting element having a different structure from those described in Embodiment 4 and Embodiment 5 with reference to FIGS. 3A to 3C and FIGS. 4A to 4C. In the structure shown in this embodiment, layers each containing a composite material can be provided so as to be in contact with two electrodes of a light emitting element respectively.

Figure 3A:
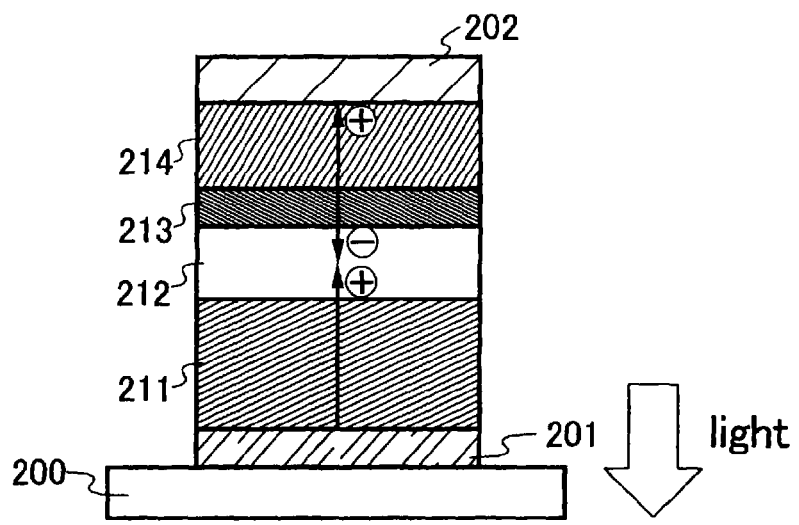
FIGS. 3A to 3C are diagrams for explaining a light emitting element of the present invention.

FIG. 3A shows an example of a structure of the light emitting element of the invention. A first layer 211, a second layer 212, a third layer 213, and a fourth layer 214 are stacked in this order, which are sandwiched between a first electrode 201 and a second electrode 202. This embodiment illustrates a case where the first electrode 201 functions as an anode while the second electrode 202 functions as a cathode.

The first electrode 201 and the second electrode 202 may have the same structure as that of Embodiment 4. In addition, the first layer 211 is a layer containing a composite material shown in Embodiment 1, and the second layer 212 is a layer containing a material having a high light emitting property and a high carrier transporting property. Specifically, a structure described in Embodiment 2 can be used. Further, the second layer 212 may have a layer containing a material having a high hole injecting property, a material having high hole transporting material, a material having a high electron transporting property, or the like. The third layer 213 is a layer containing a material having a high electron donating property and a material having a high electron transporting property, and the fourth layer 214 is a layer containing a composite material shown in Embodiment 1. An electron-donating material contained in the third layer 213 is preferably an alkali metal, an alkaline earth metal, oxide thereof, or salt. Specifically, there are lithium, cesium, calcium, lithium oxide, calcium oxide, barium oxide, cesium carbonate, and the like.

With such a structure, electrons are given/received in the vicinity of an interface between the third layer 213 and the fourth layer 214 by applying a voltage as shown in FIG. 3A, and electrons and holes are generated. At this time, the third layer 213 transports electrons to the second layer 212 while the fourth layer 214 transports holes to the second electrode 202. That is, the third layer 213 and the fourth layer 214 jointly function as a carrier generating layer. In addition, the fourth layer 214 also has a function to transport holes to the second electrode 202. Note that by providing another set of the second layer and the third layer between the fourth layer 214 and the second electrode 202, a tandem light emitting element can be formed.

Since the drive voltage can be prevented from increasing even if the first layer 211 and the fourth layer 214 are formed thick, the thickness of the first layer 211 and the fourth layer 214 can be freely set, and the extraction efficiency of light emitted from the second layer 212 can be improved. In addition, the thickness of the first layer 211 and the fourth layer 214 may be set so as to improve the color purity of light emitted from the second layer 212.

In the light emitting element of this embodiment, layers between the second layer having a light emitting function and the anode, and layers between the second layer and the cathode can be formed quite thick; therefore, short circuit of the light emitting element can be effectively prevented. When taking FIG. 3A for instance, if the second electrode 202 is deposited by sputtering, damages caused to the second layer 212 which is a light emitting region having a multiple quantum well structure can be reduced. Further, by forming the first layer 211 and the fourth layer 214 by using the same material, layers formed of the same material can be provided on opposite sides of the layer having a light emitting function; therefore, distortion due to stress can be suppressed.

Note that the light emitting element of this embodiment may also have a variety of structures by changing the materials of the first electrode 201 and the second electrode 202. FIGS. 3B and 3C and FIGS. 4A to 4C show the schematic views thereof. Note that the same reference numerals as those in FIG. 3A are used in FIGS. 3B and 3C and FIGS. 4A to 4C. Reference numeral 200 denotes a substrate for supporting a light emitting element of the invention.

Figure 3B:
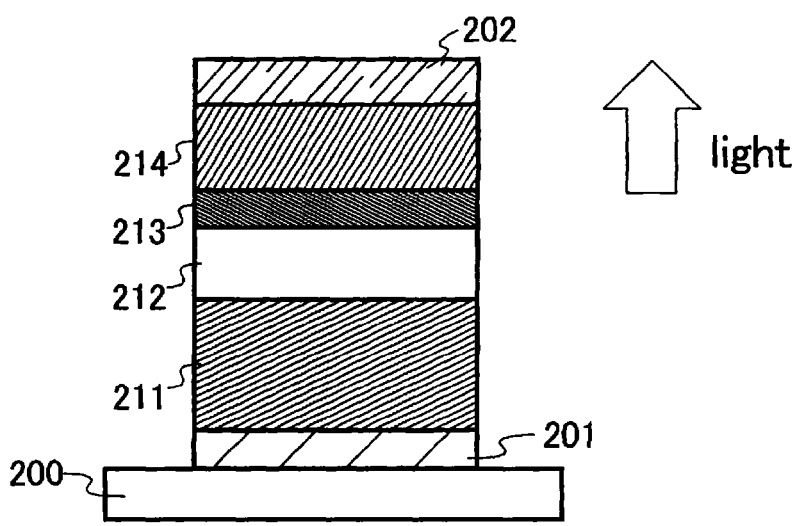
Figure 3C:
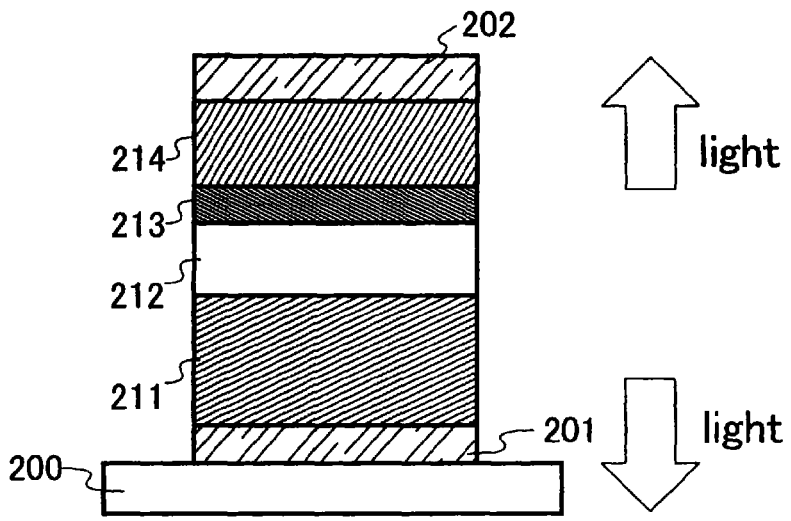

FIGS. 3A to 3C show examples where the first layer 211, the second layer 212, the third layer 213, and the fourth layer 214 are formed in this order over the substrate 200. When forming the first electrode 201 to transmit light, and forming the second electrode 202 to shield light (reflect light, in particular), light can be emitted from the substrate 200 side as shown in FIG. 3A. When forming the first electrode 201 to shield light (reflect light, in particular), and forming the second electrode 202 to transmit light, light can be emitted from the opposite side of the substrate 200 as shown in FIG. 3B. Further, when forming both of the first electrode 201 and the second electrode 202 to transmit light, light can be emitted from both of the substrate 200 side and the opposite side thereof as shown in FIG. 3C.

Figure 4A:
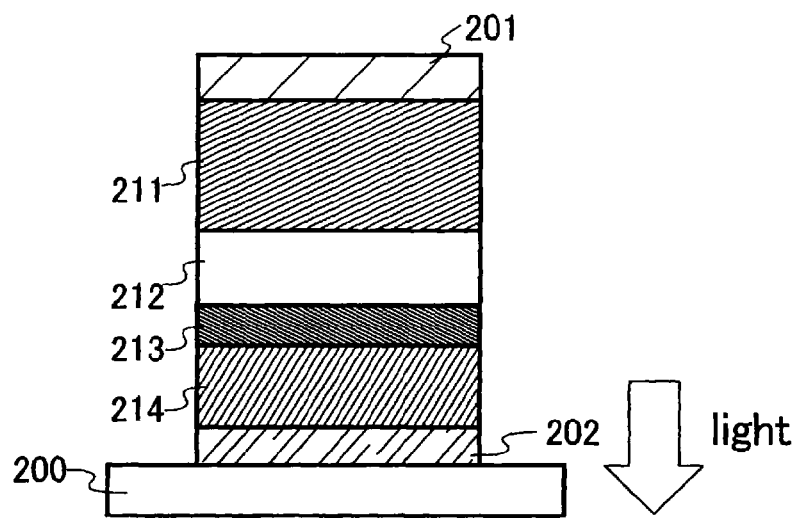
FIGS. 4A to 4C are diagrams for explaining a light emitting element of the present invention.
Figure 4B:
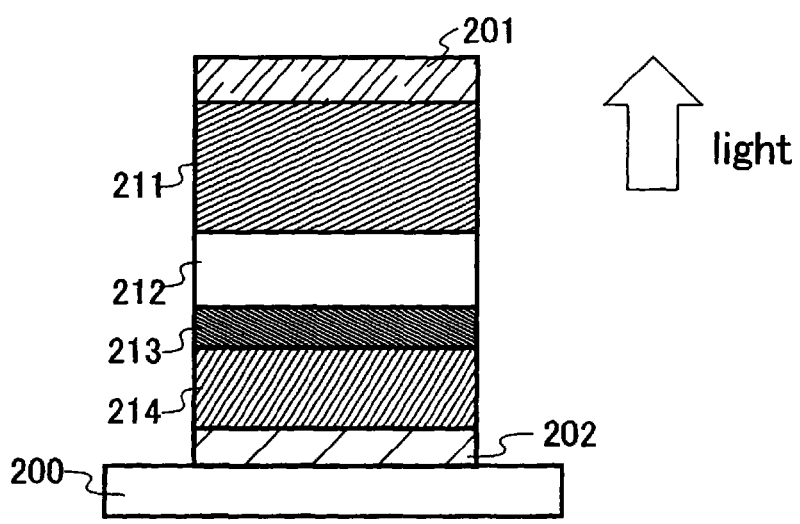
Figure 4C:
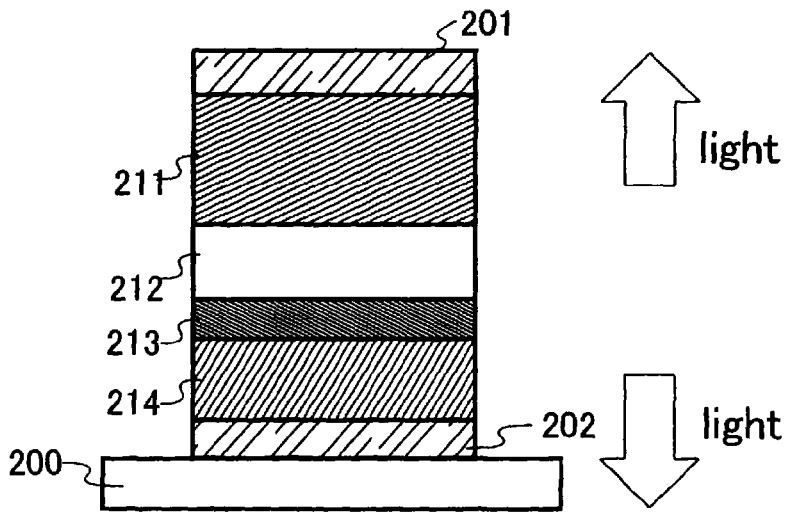

FIGS. 4A to 4C show examples where the fourth layer 214, the third layer 213, the second layer 212, and the first layer 211 are formed in this order over the substrate 200. When forming the first electrode 201 to shield light (reflect light, in particular), and forming the second electrode 202 to transmit light, light can be emitted from the substrate 200 side as shown in FIG. 4A. When forming the first electrode 201 to transmit light, and forming the second electrode 202 to shield light (reflect light, in particular), light can be emitted from the opposite side of the substrate 200 as shown in FIG. 4B. Further, when forming both of the first electrode 201 and the second electrode 202 to transmit light, light can be emitted from both of the substrate 200 side and the opposite side thereof as shown in FIG. 4C.

Note that such a structure can also be employed that the first layer 211 is a layer containing a material selected from among electron-donating substances and also containing a compound with a high electron transporting property, the second layer 212 is a layer containing a light emitting substance, the third layer 213 is a layer containing a composite material shown in Embodiment 1, and the fourth layer 214 is a layer containing a material selected from among electron-donating substances and also containing a compound with a high electron transporting property.

Note that the light emitting element of this embodiment can be manufactured by a known method regardless of a wet method process or a dry process. However, the layer containing a material having a high light emitting property and a high carrier transporting property is preferably formed by the method shown in Embodiment 3.

In addition, the light emitting element may be formed either in a manner shown in FIGS. 3A to 3C where the first electrode 201, the first layer 211, the second layer 212, the third layer 213, the fourth layer 214, and the second electrode 202 are stacked in this order, or in a manner shown in FIGS. 4A to 4C where the second electrode 202, the fourth layer 214, the third layer 213, the second layer 212, the first layer 211, and the first electrode are stacked in this order.

Note that this embodiment can be appropriately combined with any of the other embodiments.

Embodiment 7

In this embodiment, an optical design of a light emitting element will be explained.

In each of the light emitting elements described in Embodiments 4 to 6, light extraction efficiency of each emission color can be improved by differentiating the thickness of at least one of the layers except the first electrode and the second electrode in light emitting element which emits each emission color.

Figure 10:
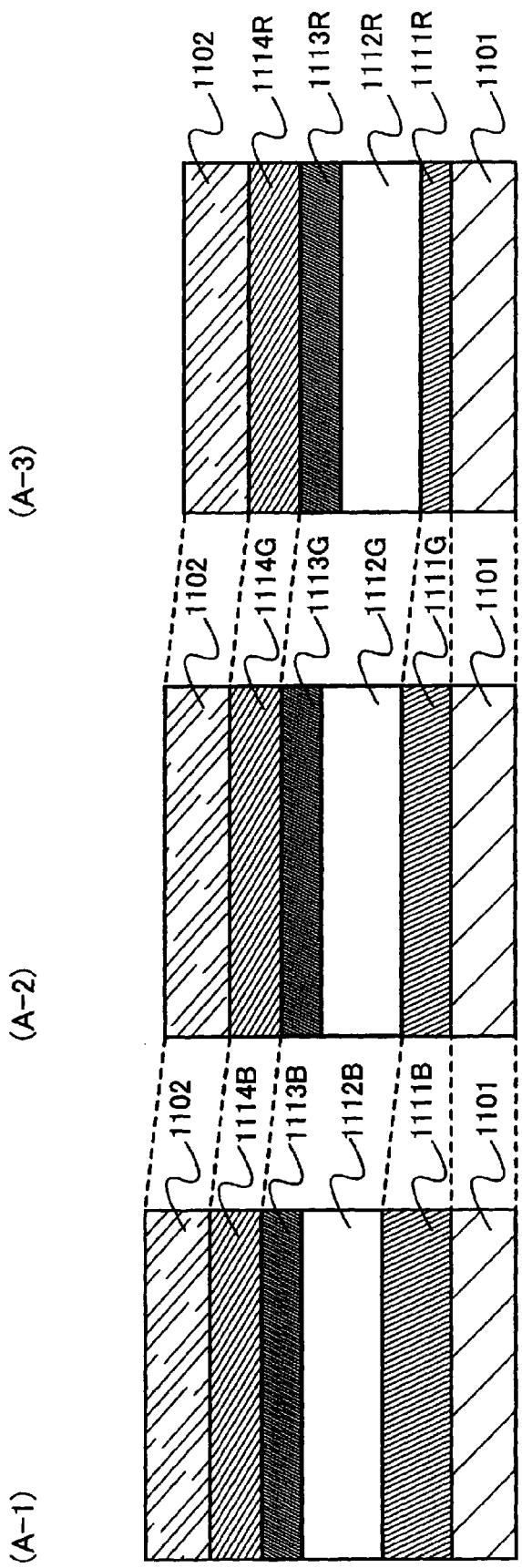

For example, as shown in FIGS. 10A-1 to 10A-3, light emitting elements which individually emit light of red (R), green (G), and blue (B) share a first electrode 1101 that is a reflective electrode and a second electrode 1102 having a light-transmitting property, and have first layers 1111R, 1111G, and 1111B, second layers 1112R, 1112G, and 1112B, third layers 1113R, 1113G, and 1113B, and fourth layers 1114R, 1114G, and 1114B, respectively. Then, thicknesses of the first layers 1111R, 1111G, and 1111B are differentiated for each emission color.

Note that in each of the light emitting elements shown in FIGS. 10A-1 to 10A-3, when voltage is applied so that the potential of the first electrode 1101 becomes higher than that of the second electrode 1102, holes are injected from the first layers 1111 to the second layers 1112. Electrons are donated and accepted in the vicinity of the interfaces between the third layers 1113 and the fourth layers 1114; electrons and holes are generated; and the fourth layers 1114 transport the holes to the second electrode 1102 while the third layers 1113 transport the electrons to the second layers 1112. The holes and the electrons are recombined in the second layers 1112 to excite each light emitting material. Then, the excited light emitting material emits light when returning to a ground state.

As shown in FIGS. 10A-1 to 10A-3, by differentiating thicknesses of the first layers 1111R, 1111G, and 111B for each emission color, a decrease in light extraction efficiency can be prevented which is caused by a difference in light path between the case of recognizing light directly through the second electrode and the case of recognizing light reflected by the first electrode through the second electrode.

Specifically, when light enters the first electrode, phase reversal occurs in the reflected light, thereby causing a light interference effect. Consequently, in the case where an optical distance between a light emitting region and a reflective electrode (i.e., refractive index×distance) is the emission wavelength multiplied by (2 m−1)/4 (m is a given positive integer), namely, ¼, ¾, 5/4 . . . of the emission wavelength, the light external extraction efficiency is increased. Meanwhile, in the case where the optical distance is the emission wavelength multiplied by m/2 (m is a given positive integer) or ½, 1, 3/2 . . . of the emission wavelength, the light external extraction efficiency is decreased.

Therefore, among light emitting elements of the invention, thicknesses of any of the first to fourth layers are differentiated so that the optical distance between the light emitting region and the reflective electrode (i.e., refractive index× distance) is the emission wavelength multiplied by (2 m−1)/4 (m is a given positive integer).

In particular, in the first to fourth layers, thicknesses of the layers between the layers in which electrons and holes are recombined and the reflective electrodes are preferably differentiated. Alternatively, thicknesses of the layers between the layers in which electrons and holes are recombined and the light-transmitting electrode may be differentiated. Further alternatively, thicknesses of both layers may be differentiated. Consequently, light can be extracted outside efficiently.

In order to differentiate thicknesses of any of the first to fourth layers, the layer needs to be thickened. One feature of the light emitting element of the invention is that a layer containing the composite material described in Embodiment 1 is used for a layer to be thickened.

Generally, when a layer of the light emitting element is thickened, the drive voltage is increased, which is not preferable. However, by using the composite material described in Embodiment 1 for the layer to be thickened, the drive voltage itself can be decreased, which can suppress an increase in the drive voltage due to thickening.

Note that FIGS. 10A-1 to 10A-3 shows the case where an optical distance between the light emitting region and the reflective electrode of the light emitting element of red (R) is ¼ of the emission wavelength; an optical distance between the light emitting region and the reflective electrode of the light emitting element of green (G) is ¾ of the emission wavelength; and an optical distance between the light emitting region and the reflective electrode of the light emitting element of blue (B) is 5/4 of the emission wavelength. Note that the invention is not limited to these values, and the value of m can be set appropriately. As shown in FIGS. 10A-1 to 10A-3, values of m in (2m−1)/4 of the emission wavelength may be different among the light emitting elements.

By thickening any of the first to fourth layers, a short circuit between the first and second electrodes can be prevented and mass productivity can be improved, which is very preferable.

As described above, thicknesses of at least the first to fourth layers in the light emitting element of the invention can be differentiated for each emission color. At this time, thicknesses of the layers between the layers in which electrons and holes are recombined and the reflective electrodes are preferably differentiated for each emission color. If a layer containing the composite material described in Embodiment 1 is used for the layer which needs to be thickened, the drive voltage is not increased, which is preferable.

Note that this embodiment is explained the case of a light emitting element having a structure described in Embodiment 6, but it can be appropriately combined with another embodiment.

Embodiment 8

In this embodiment, a light emitting device having a light emitting element of the invention will be explained.

A light emitting device having a light emitting element of the invention in a pixel portion will be explained in this embodiment with reference to FIGS. 7A and 7B. FIG. 7A is a top view showing the light emitting device and FIG. 7B is a cross-sectional view of FIG. 7A taken along line A-A' and B-B'. Reference numeral 601 indicated by dashed line denotes a driver circuit area (a source driver circuit); 602, a pixel portion; and 603, a driver circuit area (a gate driver circuit). Reference numeral 604 denotes a sealing substrate; 605, a sealant; and a portion surrounded by the sealant 605 is a space 607.

Note that a lead wiring 608 is a wiring for transmitting a signal to be inputted to the source driver circuit 601 and the gate driver circuit 603 and receives a video signal, a clock signal, a start signal, a reset signal, or the like from an FPC (flexible printed circuit) 609 that is an external input terminal. Note that only the FPC is shown here; however, the FPC may be provided with a printed wiring board (PWB). The light emitting device in this specification includes not only a light emitting device itself but also a light emitting device mounted with an FPC or a PWB attached.

Subsequently, a cross-sectional structure will be explained with reference to FIG. 7B. The driver circuit area and the pixel portion are formed over an element substrate 610. Here, the source driver circuit 601 which is the driver circuit area and one pixel in the pixel portion 602 are shown.

Note that a CMOS circuit which is a combination of an n-channel TFT 623 and a p-channel TFT 624 is formed as the source driver circuit 601. A TFT for forming the driver circuit may be formed using a known CMOS circuit, a PMOS circuit, or an NMOS circuit. A driver integration type in which a driver circuit is formed over a substrate is described in this embodiment, but it is not necessarily required and a driver circuit can be formed outside a substrate.

The pixel portion 602 has a plurality of pixels, each of which includes a switching TFT 611, a current control TFT 612, and a first electrode 613 which is electrically connected to a drain of the current control TFT 612. Note that an insulator 614 is formed to cover an end of the first electrode 613. Here, a positive type photosensitive acrylic resin film is used.

The insulator 614 is formed to have a curved surface at an upper end or a lower end thereof in order to make the coverage favorable. For example, in the case of using positive type photosensitive acrylic for a material of the insulator 614, the insulator 614 is preferably formed to have a curved surface with a curvature radius (0.2 μm to 3 μm) only at an upper end. Either a negative type which becomes insoluble in an etchant by light irradiation or a positive type which becomes soluble in an etchant by light irradiation can be used as the insulator 614.

A layer 616 containing a light emitting material and a second electrode 617 are formed over the first electrode 613. Here, a material having a high work function is preferably used as a material used for the first electrode 613 which functions as an anode. For example, the first electrode 613 can be formed by using a single-layer film such as an ITO film, an indium tin oxide film containing silicon, an indium oxide film containing zinc oxide of 2 wt % to 20 wt %, a titanium nitride film, a chromium film, a tungsten film, a Zn film, or a Pt film; a stack of a titanium nitride film and a film containing aluminum as its main component; a three-layer structure of a titanium nitride film, a film containing aluminum as its main component, and another titanium nitride film; or the like. When the first electrode 613 has a layered structure, it can have low resistance as a wiring and form a good ohmic contact. Further, the first electrode can serve as an anode.

The layer 616 containing a light emitting substance has a light emitting region including a layer containing a composite material shown in Embodiment 1 and a material having a high light emitting property and a light emitting region having a high carrier transporting property. As other materials which constitute the layer 616 containing a light emitting substance, a low molecular weight material, a medium molecular material (including oligomer and dendrimer), or a high molecular weight material may be used. The materials used for the layer containing a light emitting substance are generally formed in a single layer or a stacked layer of organic compounds. In the invention, such a structure can also be employed that a film formed of an organic compound partially includes an inorganic compound. In addition, the layer 616 containing a light emitting substance may be formed by a known method such as vapor deposition using a vapor-deposition mask, ink-jet deposition, or spin coating. Note that the le region is preferably formed by the method shown in Embodiment 3.

As a material used for the second electrode 617 which is formed over the layer 616 containing a light emitting material and functions as a cathode, a material having a low work function (Al, Ag, Li, Ca, or an alloy or a compound thereof such as MgAg, MgIn, AlLi, $CaF_2$, LiF, or calcium nitride) is preferably used. In the case where light generated in the layer 616 containing a light emitting material is transmitted through the second electrode 617, a stack of a metal thin film with a thin thickness and a transparent conductive film (of ITO, indium oxide containing zinc oxide of 2 wt % to 20 wt %, indium tin oxide containing silicon, zinc oxide (ZnO), or the like) is preferably used as the second electrode 617.

By attaching the sealing substrate 604 to the element substrate 610 with the sealant 605, a light emitting element 618 is provided in the space 607 surrounded by the element substrate 610, the sealing substrate 604, and the sealant 605. Note that the space 607 is filled with a filler, but there the space 607 may be filled with the sealant 605 as well as an inert gas (nitrogen, argon, or the like).

Note that an epoxy-based resin is preferably used for the sealant 605. The material preferably allows as little moisture and oxygen as possible to penetrate. As the sealing substrate 604, a plastic substrate formed of FRP (Fiberglass-Reinforced Plastics), PVF (polyvinyl fluoride), Myler, polyester, acrylic, or the like can be used other than a glass substrate or a quartz substrate.

As described above, a light emitting device having a light emitting element of the invention can be obtained.

Since a light emitting device of the invention includes a layer containing a composite material described in Embodiment 1, the drive voltage can be reduced and the power consumption can be reduced.

Further, even in the case where the thickness of the layer containing a composite material is increased, increase in the drive voltage of a light emitting device of the invention can be suppressed. Accordingly, by increasing the film thickness of the layer containing a composite material, irregularities due to minute foreign bodies or the like can be reduced, and a light emitting region having a multiple quantum well structure can be formed over a flat layer. Thus, a multiple quantum well structure with less defects can be formed, the effects of the multiple quantum well structure can be further exerted and a light emitting element with high luminous efficiency can be obtained.

Further, by increasing the thickness of the layer containing a composite material, a short circuit in a light emitting element can be prevented. Further, the color purity can be improved and the extraction efficiency of light to the outside can be improved by the optical design. Consequently, a light emitting device with high reliability which consumes low power consumption can be obtained.

Figure 8:
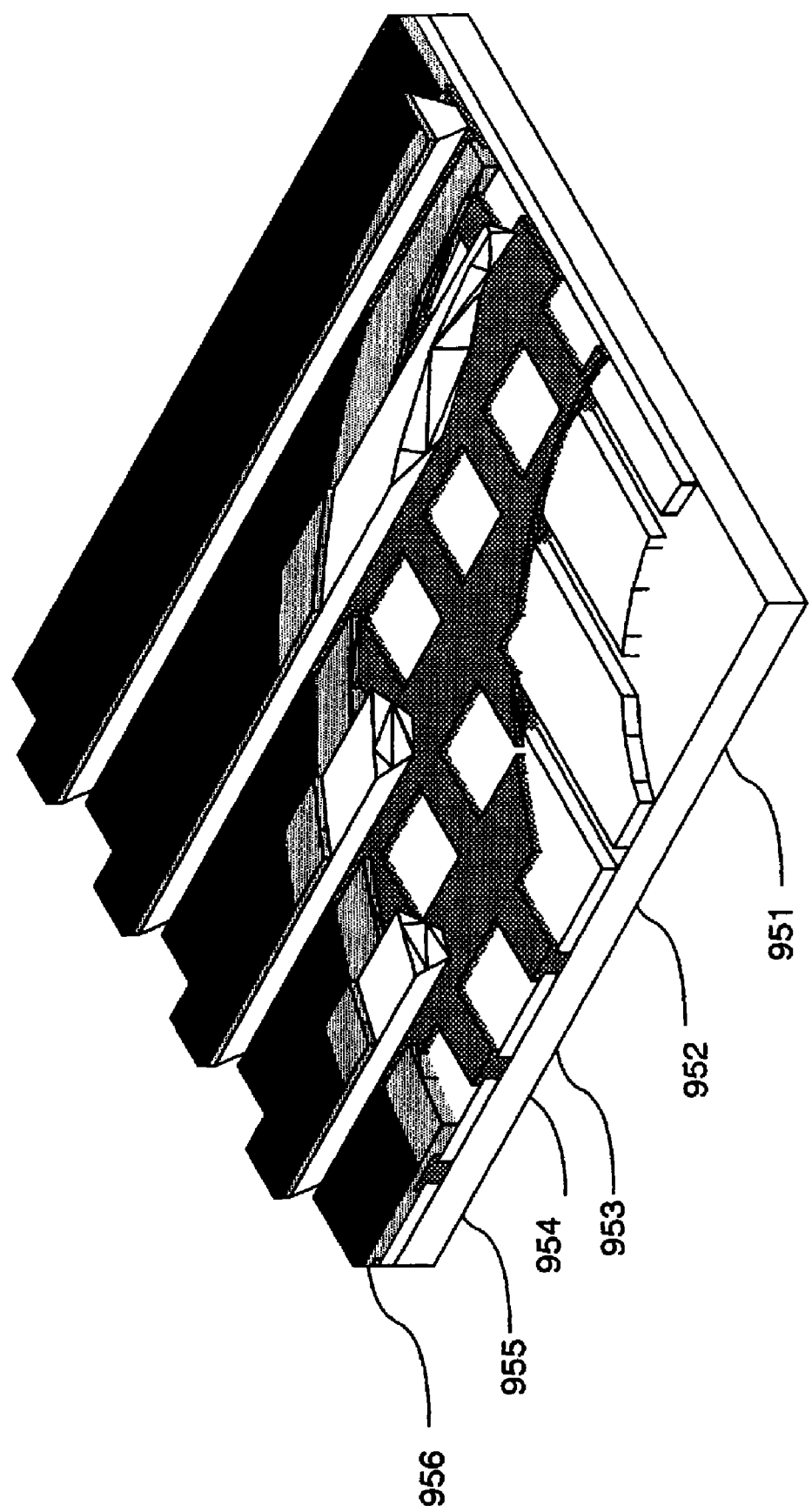
FIG. 8 is a diagram for explaining a light emitting device of the present invention.

As described heretofore, although this embodiment illustrates an active matrix light emitting device where drive of light emitting elements is controlled with TFTs, a passive matrix light emitting device may be formed as well, where light emitting elements are driven without specifically providing driving elements such as transistors. FIG. 8 shows a perspective view of a passive matrix light emitting device manufactured in accordance with the invention. In FIG. 8, a layer 955 containing a light emitting substance is provided between an electrode 952 and an electrode 956 over a substrate 951. An end portion of the electrode 952 is covered with an insulating layer 953. Over the insulating layer 953, a partition layer 954 is provided. The partition layer 954 has tapered sidewalls with such a slope that the distance between opposite sidewalls diminishes toward the substrate surface. That is, the cross section of the partition layer 954 in the short side direction has a trapezoidal shape where a bottom base (side in the same direction as the surface direction of the insulating layer 953, which is in contact with the insulating layer 953) is shorter than a top base (side in the same direction as the surface direction of the insulating layer 953, which is not in contact with the insulating layer 953). By providing the insulating layer 954 in this manner, defects of light emitting elements resulting from static electricity or the like can be prevented. Further even a passive matrix light emitting device can be driven with low power consumption by including a light emitting element of the invention with high luminous efficiency which can operate with low drive voltage.

Embodiment 9

In this embodiment, description is made on electronic apparatuses of the invention each having a light emitting device shown in Embodiment 8 as its component. The electronic apparatus of the invention includes a layer containing a composite material shown in Embodiment 1, and has a display area with low power consumption. The electronic apparatus of the invention also has a highly reliable display area where short circuit caused by minute foreign bodies, external shocks, or the like is suppressed.

As an electronic apparatus manufactured with the light emitting device of the invention includes a camera such as a video camera or a digital camera, a goggle type display, a navigation system, an audio reproducing device (e.g., car audio, audio component stereo, or the like), a computer, a game machine, a portable information terminal (e.g., mobile computer, portable phone, portable game machine, electronic book, or the like), an image reproducing device provided with a recording medium (specifically, a device for reproducing a recording medium such as a digital versatile disc (DVD) and having a display device for displaying the reproduced image), and the like. Specific examples of such electronic apparatuses are shown in FIG. 9A to FIG. 9E.

Figure 9A:
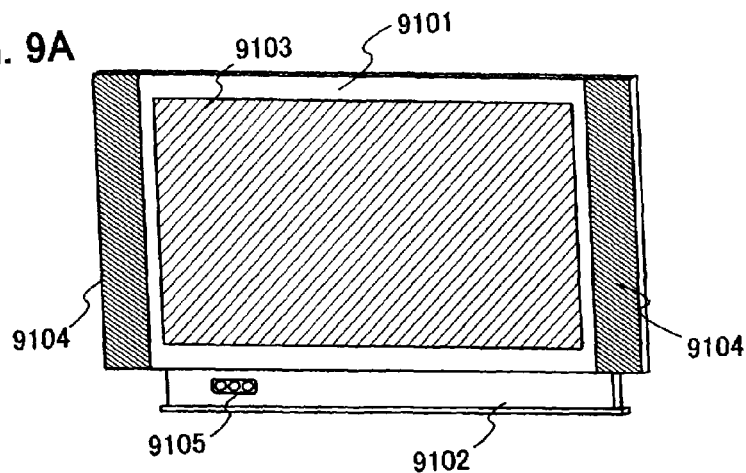
FIGS. 9A to 9E are diagrams for explaining electric devices using a light emitting device of the present invention.

FIG. 9A shows a television set in accordance with the invention, which includes a housing 9101, a supporting base 9102, a display area 9103, speaker portions 9104, a video input terminal 9105, and the like. In this television set, the display area 9103 has a matrix arrangement of light emitting elements which are similar to the ones described in Embodiments 4 to 7. The light emitting elements have such advantages that the luminous efficiency is high, the drive voltage is low, and short circuit due to minute foreign bodies, external shocks, and the like can be prevented. Since the display area 9103 constructed of such light emitting elements has similar characteristics, this television set has no degradation in image quality and consumes low power. With such characteristics, the television set can have a significantly reduced number or size of a degradation correction function and power source circuits. Therefore, the housing 9101 and the supporting base 9102 can be reduced in size and weight. Since the television set in accordance with the invention can achieve low power consumption, high image quality and reduction in size and weight, products suitable for any residential environment can be provided.

Figure 9B:
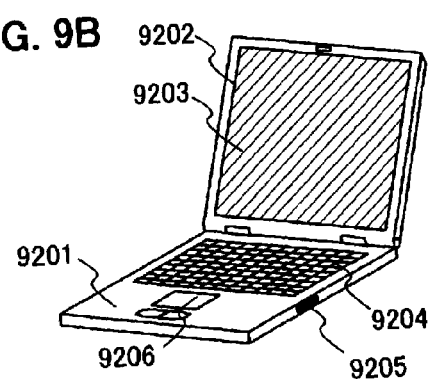

FIG. 9B shows a computer in accordance with the invention, which includes a main body 9201, a housing 9202, a display area 9203, a keyboard 9204, an external connecting port 9205, a pointing mouse 9206, and the like. In this computer, the display area 9203 has a matrix arrangement of light emitting elements which are similar to the ones described in Embodiments 4 to 7. The light emitting elements have such advantages that the luminous efficiency is high, the drive voltage is low, and short circuit due to minute foreign bodies, external shocks, and the like can be prevented. Since the display area 9203 constructed of such light emitting elements has similar characteristics, this computer has no degradation in image quality and consumes low power. With such characteristics, the computer can have a significantly reduced number or size of a degradation correction function and power source circuits. Therefore, the main body 9201 and the housing 9202 can be reduced in size and weight. Since the computer in accordance with the invention can achieve low power consumption, high image quality, and reduction in size and weight, products suitable for any residential environment and portable use can be provided. Further, the invention can provide a computer, a display area of which is resistant to shocks even when carried outside.

Figure 9C:
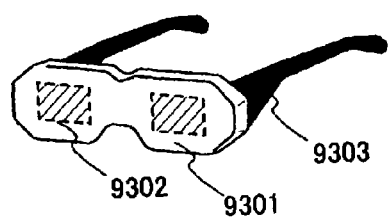

FIG. 9C shows a goggle display in accordance with the invention, which includes a main body 9301, a display area 9302, an arm portion 9303, and the like. In this goggle display, the display area 9302 has a matrix arrangement of light emitting elements which are similar to the ones described in Embodiments 4 to 7. The light emitting elements have such advantages that the luminous efficiency is high, the drive voltage is low, and short circuit due to minute foreign bodies, external shocks, and the like can be prevented. Since the display area 9302 constructed of such light emitting elements has similar characteristics, this goggle display has no degradation in image quality, and consumes low power. With such characteristics, the goggle display can have a significantly reduced number or size of a degradation correction function and power source circuits. Therefore, the main body 9301 can be reduced in size and weight. Since the goggle display in accordance with the invention can achieve low power consumption, high image quality and reduction in size and weight, the user suffers few uncomfortable feeling, and thus comfortable products can be provided. Further, the invention can provide a goggle display, a display area of which is resistant to shocks even when a user moves with his/her goggle display on.

Figure 9D:
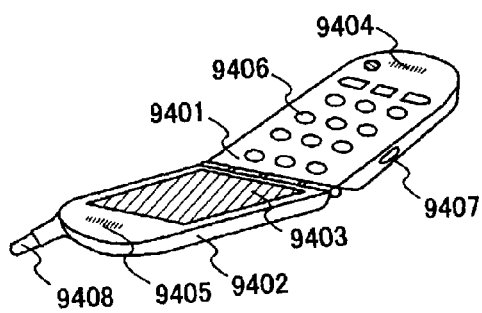

FIG. 9D shows a portable phone in accordance with the invention, which includes a main body 9401, a housing 9402, a display area 9403, an audio input portion 9404, an audio output portion 9405, an operating key 9406, an external connecting port 9407, an antenna 9408, and the like. In this portable phone, the display area 9403 has a matrix arrangement of light emitting elements which are similar to the ones described in Embodiments 4 to 7. The light emitting elements have such advantages that the luminous efficiency is high, the drive voltage is low, and short circuit due to minute foreign bodies, external shocks, and the like can be prevented. Since the display area 9403 constructed of such light emitting elements has similar characteristics, this portable phone has no degradation in image quality and consumes low power. With such characteristics, the portable phone can have a significantly reduced number or size of a degradation correction function and power source circuits. Therefore, the main body 9401 and the housing 9402 can be reduced in size and weight. Since the portable phone in accordance with the invention can achieve low power consumption, high image quality, and reduction in size and weight, products suitable for portable use can be provided. Further, the invention can provide products, a display area of which is resistant to shocks even when carried outside.

Figure 9E:
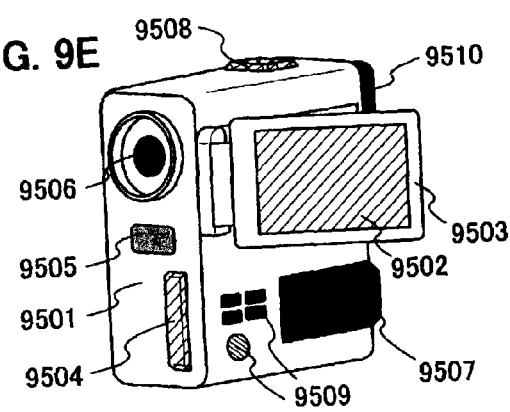

FIG. 9E shows a camera in accordance with the invention, which includes a main body 9501, a display area 9502, a housing 9503, an external connecting port 9504, a remote controller receiving portion 9505, an image receiving portion 9506, a battery 9507, an audio input portion 9508, operating keys 9509, an eye piece portion 9510, and the like. In this camera, the display area 9502 has a matrix arrangement of light emitting elements which are similar to the ones described in Embodiments 3 to 7. The light emitting elements have such advantages that the extraction efficiency of light to the outside is high, the drive voltage is low, and short circuit due to minute foreign bodies, external shocks, and the like can be prevented. In addition, cross talk which would be generated between adjacent light emitting elements can be suppressed. Since the display area 9502 constructed of such light emitting elements has similar characteristics, this camera has no degradation in image quality and consumes low power. With such characteristics, the camera can have a significantly reduced number or size of a degradation correction function and power source circuits. Therefore, the main body 9501 can be reduced in size and weight. Since the camera in accordance with the invention can achieve low power consumption, high image quality, and reduction in size and weight, products suitable for portable use can be provided. Further, the invention can provide products, a display area of which is resistant to shocks even when carried outside.

As described above, the applicable range of the light emitting device of the invention is so wide that the light emitting device can be applied to electronic apparatuses in various fields. By using the light emitting device of the invention, electronic apparatuses having display areas with low power consumption and high reliability can be provided.

What is claimed is:

1. A light emitting device comprising a light emitting element comprising:
   a first electrode;
   a first layer comprising an organic compound and an inorganic compound over the first electrode; and
   a second layer comprising a first, second and third regions over the first layer,
   wherein the second region is formed between the first region and the third region,
   wherein each of the first, second and third regions comprises a material having a high light emitting property and a material having a high carrier transporting property,
   wherein a concentration of the material having a high carrier transporting property is higher than a concentration of the material having a high light emitting property in the first and third regions,
   wherein a concentration of the material having a high light emitting property is higher than a concentration of the material having a high carrier transporting property in the second region, and
   wherein the concentration of the material having a high light emitting property periodically changes in the second layer.

2. A light emitting device according to claim 1, wherein a highest occupied molecular orbital level of the material having a high light emitting property is higher than a highest occupied molecular orbital level of the material having a high carrier transporting property, and a lowest unoccupied molecular orbital of the material having a high light emitting property is lower than a lowest unoccupied molecular orbital level of the material having a high carrier transporting property.

3. A light emitting device according to claim 1, wherein the second region has a thickness of 20 nm or less.

4. A light emitting device according to claim 1, wherein the second region has a thickness of 5 nm or less.

5. A light emitting device according to claim 1, wherein the first and third regions have a thickness of 20 nm or less.

6. A light emitting device according to claim 1, wherein the first and third regions have a thickness of 5 nm or less.

7. A light emitting device according to claim 1, wherein the material having a high light emitting property fluoresces.

8. A light emitting device according to claim 1, wherein the material having a high light emitting property phosphoresces.

9. A light emitting device according to claim 8, wherein a triplet level of the material having a high light emitting property is lower than a triplet level of the material having a high carrier transporting property.

10. A light emitting device according to claim 1, wherein the material having a high carrier transporting property has an electron transporting property higher than a hole transporting property.

11. A light emitting device according to claim 1, wherein the material having a high carrier transporting property has a hole transporting property higher than an electron transporting property.

12. A light emitting device according to claim 1, wherein the light emitting element further comprises:
    a third layer comprising an organic compound and an inorganic compound over the second layer; and
    a second electrode over and in contact with the third layer.

13. A light emitting device according to claim 12, wherein the first layer is provided in contact with one of the first and second electrodes.

14. A light emitting device according to claim 1, wherein the inorganic compound is a transition metal oxide.

15. A light emitting device according to claim 1, wherein the inorganic compound is one selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide, and a mixture thereof.

16. A light emitting device according to claim 1, wherein the organic compound has hole transporting property.

17. A light emitting device according to claim 1, wherein the organic compound is one of an organic compound having an arylamine skeleton and an organic compound having a carbazole skeleton.

18. A light emitting device comprising a light emitting element comprising:
    a first electrode;
    a first layer comprising an organic compound and an inorganic compound over the first electrode; and
    a second layer comprising a first, second and third regions,
    wherein each of the first, second and third regions comprises a material having a high light emitting property and a material having a high carrier transporting property,
    wherein a concentration of the material having a high carrier transporting property is higher than a concentration of the material having a high light emitting property in the first and third regions,
    wherein the material having a high light emitting property is dispersed in the material having a high carrier transporting property in the second region, and
    wherein the concentration of the material having a high light emitting property periodically changes in the second layer.

19. A light emitting device according to claim 18, wherein a highest occupied molecular orbital level of the material having a high light emitting property is higher than a highest occupied molecular orbital level of the material having a high carrier transporting property, and a lowest unoccupied molecular orbital of the material having a high light emitting property is lower than a lowest unoccupied molecular orbital level of the material having a high carrier transporting property.

20. A light emitting device according to claim 18, wherein the second region has a thickness of 20 nm or less.

21. A light emitting device according to claim 18, wherein the second region has a thickness of 5 nm or less.

22. A light emitting device according to claim 18, wherein the first and third regions have a thickness of 20 nm or less.

23. A light emitting device according to claim 18, wherein the first and third regions have a thickness of 5 nm or less.

24. A light emitting device according to claim 18, wherein the second region contains 0.001 wt % to 50 wt % of the material having a high light emitting property.

25. A light emitting device according to claim 18, wherein the second region contains 0.03 wt % to 30 wt % of the material having a high light emitting property.

26. A light emitting device according to claim 18, wherein the material having a high light emitting property fluoresces.

27. A light emitting device according to claim 18, wherein the material having a high light emitting property phosphoresces.

28. A light emitting device according to claim 27, wherein a triplet level of the material having a high light emitting property is lower than a triplet level of the material having a high carrier transporting property.

29. A light emitting device according to claim 18, wherein the material having a high carrier transporting property has an electron transporting property higher than a hole transporting property.

30. A light emitting device according to claim 18, wherein the material having a high carrier transporting property has a hole transporting property higher than an electron transporting property.

31. A light emitting device according to claim 18, wherein the light emitting element further comprises:
a third layer comprising an organic compound and an inorganic compound over the second layer; and
a second electrode over and in contact with the third layer.

32. A light emitting device according to claim 31, wherein the first layer is provided in contact with one of the first and second electrodes.

33. A light emitting device according to claim 18, wherein the inorganic compound is a transition metal oxide.

34. A light emitting device according to claim 18, wherein the inorganic compound is one selected from the group consisting of titanium oxide, zirconium oxide, hafnium oxide, vanadium oxide, niobium oxide, tantalum oxide, chromium oxide, molybdenum oxide, tungsten oxide, manganese oxide, and rhenium oxide, and a mixture thereof.

35. A light emitting device according to claim 18, wherein the organic compound has hole transporting property.

36. A light emitting device according to claim 18, wherein the organic compound is one of an organic compound having an arylamine skeleton and an organic compound having a carbazole skeleton.

* * * * *